United States Patent
Sun et al.

(10) Patent No.: US 12,500,187 B2
(45) Date of Patent: Dec. 16, 2025

(54) PACKAGE COMPRISING AN INTERCONNECTION DIE LOCATED BETWEEN SUBSTRATES

(71) Applicant: QUALCOMM Incorporated, San Diego, CA (US)

(72) Inventors: Yangyang Sun, San Diego, CA (US); Zhijie Wang, San Diego, CA (US); Wei Wang, San Diego, CA (US); Marcus Hsu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 616 days.

(21) Appl. No.: 17/741,998

(22) Filed: May 11, 2022

(65) Prior Publication Data
US 2023/0369261 A1    Nov. 16, 2023

(51) Int. Cl.
*H01L 23/00* (2006.01)
*H01L 23/28* (2006.01)
*H01L 25/065* (2023.01)

(52) U.S. Cl.
CPC .............. *H01L 24/05* (2013.01); *H01L 23/28* (2013.01); *H01L 24/03* (2013.01); *H01L 24/16* (2013.01); *H01L 24/18* (2013.01); *H01L 24/29* (2013.01); *H01L 24/73* (2013.01); *H01L 25/0657* (2013.01); *H01L 2224/03436* (2013.01);
(Continued)

(58) Field of Classification Search
CPC ......... H01L 24/05; H01L 23/28; H01L 24/03; H01L 24/16; H01L 24/18; H01L 24/29; H01L 24/73; H01L 25/0657; H01L 2224/03436; H01L 2224/0346; H01L 2224/039; H01L 2224/05647; H01L 2224/16145; H01L 2224/16225; H01L 2224/18; H01L 2224/32225; H01L 2224/73; H01L 2224/732; H01L 2224/73204; H01L 2225/06513; H01L 2225/06517; H01L 2924/15311; H01L 2924/15331; H01L 2224/16227; H01L 2224/48227; H01L 2224/73265; H01L 2225/1023; H01L 2225/1041; H01L 25/105

See application file for complete search history.

(56) References Cited

U.S. PATENT DOCUMENTS 8,217,502 B2 *  7/2012  Ko ................... H01L 23/49833
                                                  257/773
8,618,654 B2 * 12/2013  Sutardja ................ H01L 25/18
                                                  257/725
(Continued)

OTHER PUBLICATIONS

International Search Report and Written Opinion—PCT/US2023/019650—ISA/EPO—Aug. 17, 2023.

Primary Examiner — Michelle Mandala
(74) Attorney, Agent, or Firm — Loza & Loza, LLP

(57) ABSTRACT

A package comprising a first substrate; a first integrated device coupled to the first substrate; an interconnection die coupled to the first substrate; a second substrate coupled to the first substrate through the interconnection die such that the first integrated device and the interconnection die are located between the first substrate and the second substrate; and an encapsulation layer coupled to the first substrate and the second substrate, wherein the encapsulation layer is located between the first substrate and the second substrate.

25 Claims, 18 Drawing Sheets

CROSS SECTIONAL PROFILE VIEW

(52) U.S. Cl.
CPC .......................... *H01L 2224/0346* (2013.01); *H01L 2224/039* (2013.01); *H01L 2224/05647* (2013.01); *H01L 2224/16145* (2013.01); *H01L 2224/16225* (2013.01); *H01L 2224/18* (2013.01); *H01L 2224/32225* (2013.01); *H01L 2224/73* (2013.01); *H01L 2224/732* (2013.01); *H01L 2224/73204* (2013.01); *H01L 2225/06513* (2013.01); *H01L 2225/06517* (2013.01); *H01L 2924/15311* (2013.01); *H01L 2924/15331* (2013.01)

(56) References Cited

U.S. PATENT DOCUMENTS

| | | | |
|---|---|---|---|
| 9,607,967 | B1 | 3/2017 | Shih |
| 2007/0018313 | A1* | 1/2007 | Gomyo ................. H01L 25/105 257/E21.503 |
| 2010/0133704 | A1 | 6/2010 | Marimuthu et al. |
| 2014/0035935 | A1 | 2/2014 | Shenoy et al. |
| 2017/0170155 | A1 | 6/2017 | Yu et al. |
| 2017/0207205 | A1* | 7/2017 | Kim ...................... H01L 25/105 |
| 2020/0013754 | A1* | 1/2020 | Gao .................... H01L 23/3135 |
| 2021/0343634 | A1* | 11/2021 | Choi ................. H01L 23/49838 |
| 2022/0102237 | A1* | 3/2022 | Deng ................ H01L 23/49827 |
| 2022/0415813 | A1* | 12/2022 | Tsai ........................ H10D 1/20 |
| 2023/0009553 | A1* | 1/2023 | Yu ..................... H01L 25/0657 |
| 2023/0197697 | A1* | 6/2023 | Pietambaram .... H01L 23/49827 257/668 |
| 2023/0207436 | A1* | 6/2023 | Elsherbini ............... H01L 23/66 257/667 |
| 2023/0420396 | A1* | 12/2023 | Acikalin ................. H01L 23/66 |

* cited by examiner

CROSS SECTIONAL PROFILE VIEW

CROSS SECTIONAL PROFILE VIEW

CROSS SECTIONAL PROFILE VIEW

CROSS SECTIONAL PROFILE VIEW

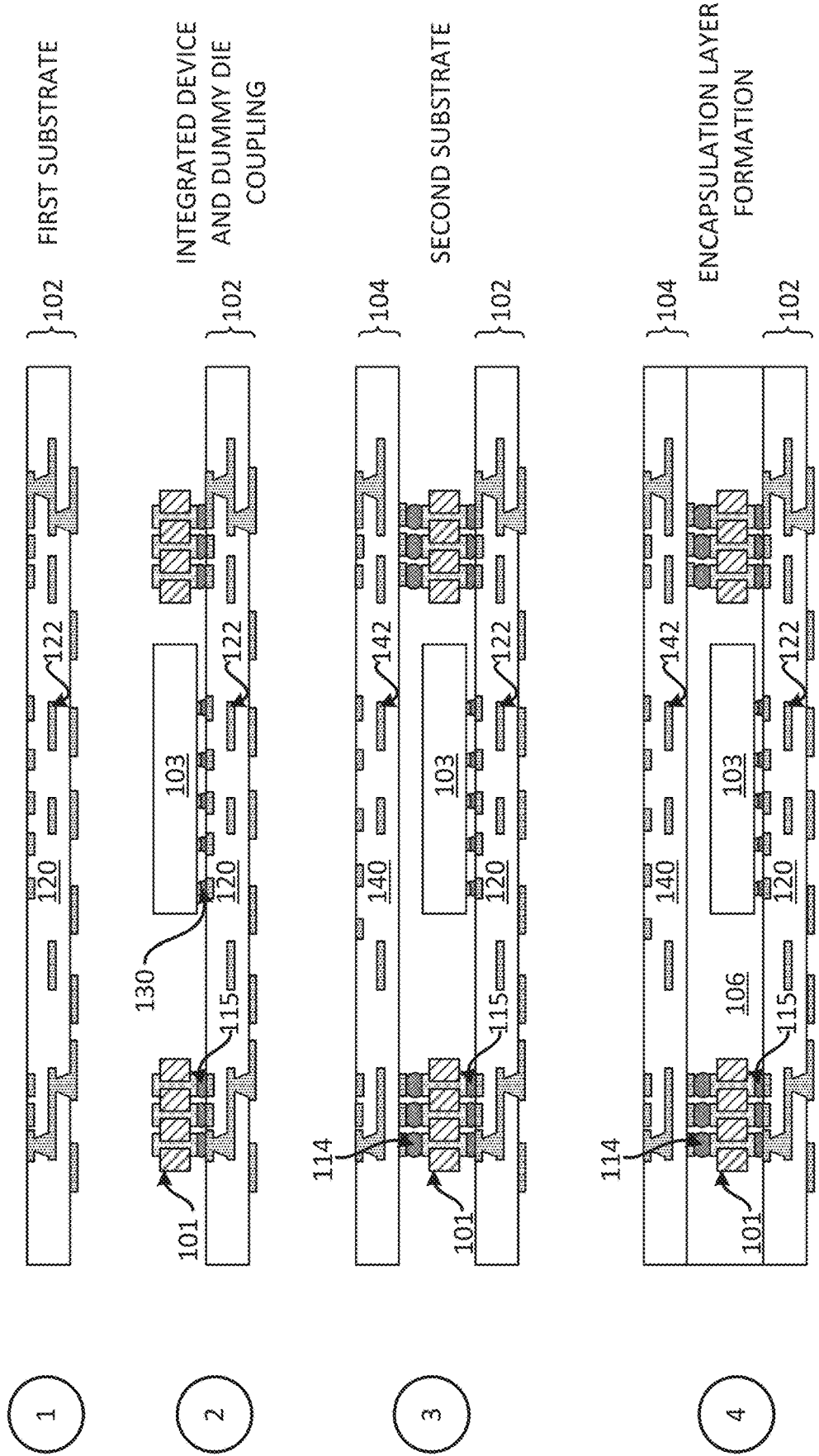

PACKAGE COMPRISING AN INTERCONNECTION DIE LOCATED BETWEEN SUBSTRATES

FIELD

Various features relate to packages with substrates and integrated devices.

BACKGROUND

A package may include a substrate and integrated devices. These components are coupled together to provide a package that may perform various electrical functions. There is an ongoing need to provide better performing packages and reduce the overall size of the packages.

SUMMARY

Various features relate to packages with substrates and integrated devices.

One example provides a package comprising a first substrate; a first integrated device coupled to the first substrate; an interconnection die coupled to the first substrate; a second substrate coupled to the first substrate through the interconnection die such that the first integrated device and the interconnection die are located between the first substrate and the second substrate; and an encapsulation layer coupled to the first substrate and the second substrate, wherein the encapsulation layer is located between the first substrate and the second substrate.

Another example provides a device that includes a first package. The first package includes a first substrate; a first integrated device coupled to the first substrate; a means for die interconnection coupled to the first substrate; a second substrate coupled to the first substrate through the means for die interconnection such that the first integrated device and the means for die interconnection are located between the first substrate and the second substrate; and an encapsulation layer coupled to the first substrate and the second substrate, wherein the encapsulation layer is located between the first substrate and the second substrate.

Another example provides a method for fabricating a package. The method provides a first substrate comprising a first surface and a second surface. The method couples a first integrated device to the second surface of the first substrate. The method couples an interconnection die to the second surface of the first substrate. The method couples a second substrate to the first substrate through the interconnection die. The second substrate comprises a first surface and a second surface. The method forms an encapsulation layer between the first substrate and the second substrate.

BRIEF DESCRIPTION OF THE DRAWINGS

Various features, nature and advantages may become apparent from the detailed description set forth below when taken in conjunction with the drawings in which like reference characters identify correspondingly throughout.

FIG. 10A-10B illustrate an exemplary sequence for fabricating a package that includes a substrate and an interconnection die.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising a first substrate comprising a first surface and a second surface; a first integrated device coupled to the second surface of the substrate; an interconnection die coupled to the second surface of the substrate; a second substrate comprising a first surface and a second surface, wherein the second substrate is coupled to the first substrate through the interconnection die; an encapsulation layer coupled to the second surface of the first substrate and the first surface of the second substrate. A second integrated device may be coupled to the second surface of the second substrate. A second package may be coupled to the second surface of the second substrate. The second package may include a third substrate, a second integrated device coupled to the third substrate, and a second encapsulation layer coupled to the third substrate and the second integrated device. As will be further described below, the package provides high density interconnection, which helps provide improved package performance, while keeping the package small and thin.

Exemplary Packages Comprising a Substrate and an Interconnection Die

Figure 1:
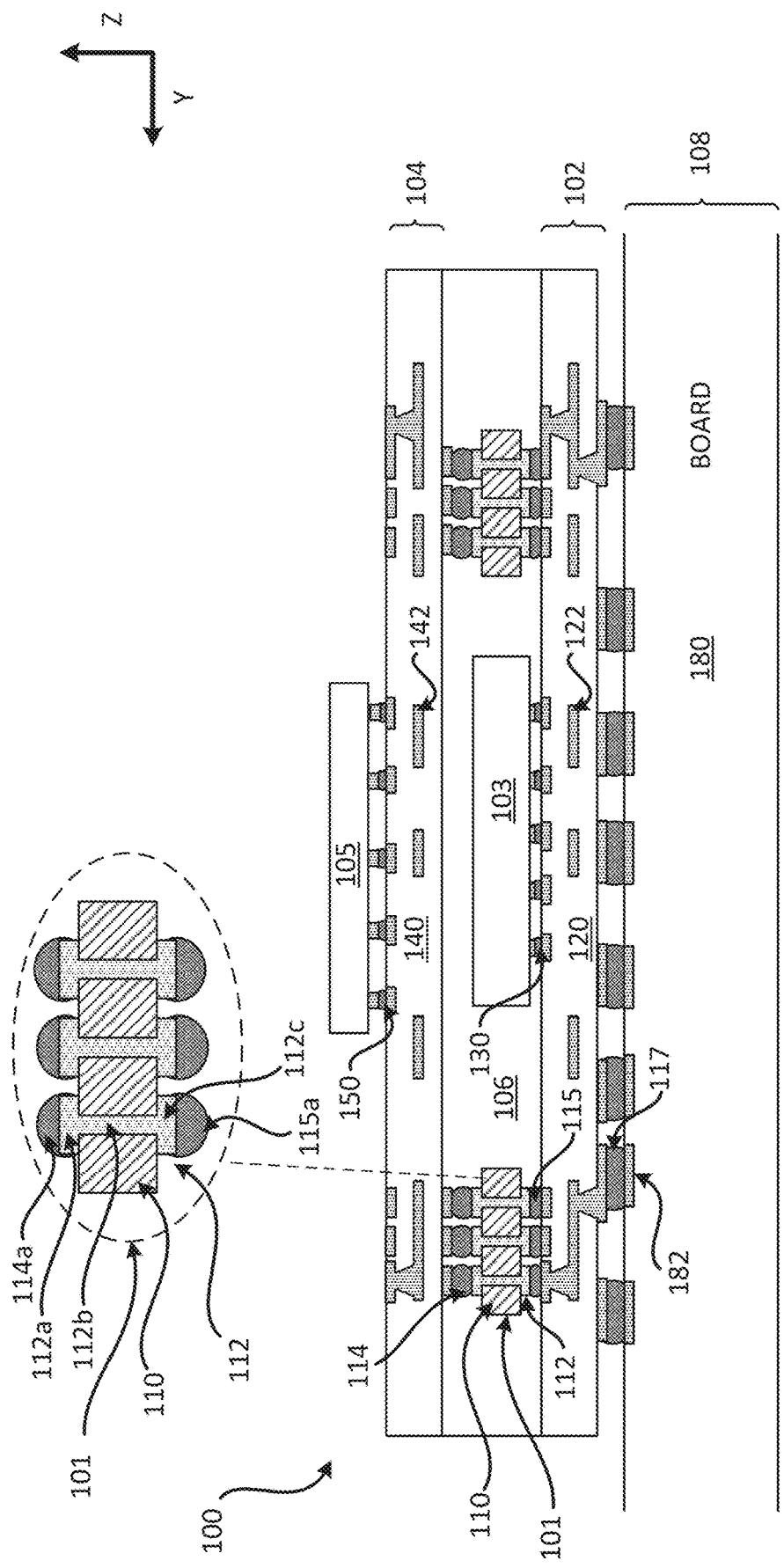
FIG. 1 illustrates an exemplary cross sectional profile view of a package that includes a substrate and at least one interconnection die.

FIG. 1 illustrates a cross sectional profile view of a package 100 that includes a substrate and a high density interconnection. The package 100 may include a package on package (PoP). The package 100 is coupled to a board 108 through a plurality of solder interconnects 117. The board 108 includes at least one board dielectric layer 180 and a plurality of board interconnects 182. The board 108 may include a printed circuit board (PCB). The package 100 is coupled to the plurality of board interconnects 182 of the board 108 through the plurality of solder interconnects 117.

The package 100 includes at least one interconnection die 101, a substrate 102, a substrate 104, an integrated device 103, an integrated device 105, and an encapsulation layer 106. The substrate 102 includes at least one dielectric layer 120 and a plurality of interconnects 122. The substrate 102 includes a first surface (e.g., bottom surface) and a second surface (e.g., top surface). The substrate 104 includes at least one dielectric layer 140 and a plurality of interconnects 142. The substrate 104 includes a first surface (e.g., bottom surface) and a second surface (e.g., top surface). The substrate 104 (e.g., second substrate) is coupled to the substrate 102 (e.g., first substrate) through the at least one interconnection die 101.

The integrated device 103 (e.g., first integrated device) is coupled to the second surface (e.g., top surface) of the substrate 102 through a plurality of solder interconnects 130. The integrated device 103 may be coupled to the substrate 102 through a plurality of pillar interconnects and/or a plurality of solder interconnects 130. The at least one interconnection die 101 may be coupled to the second surface of the substrate 102 through a plurality of solder interconnects 115. The at least one interconnection die 101 may be coupled to the first surface of the substrate 104 through a plurality of solder interconnects 114. As will be further described below, the at least one interconnection die 101 may be configured to provide high density interconnects for the package 100. The encapsulation layer 106 may be coupled to the second surface (e.g., top surface) of the substrate 102 and the first surface (e.g., bottom surface) of the substrate 104. The encapsulation layer 106 may encapsulate (e.g., partial or complete) the integrated device 103 and the at least one interconnection die 101. The encapsulation layer 106 may include a mold, a resin and/or an epoxy. The encapsulation layer 106 may be a means for encapsulation. The encapsulation layer 106 may be provided by using a compression and transfer molding process, a sheet molding process, or a liquid molding process. The encapsulation layer 106 is located between the substrate 102 and the substrate 104. The at least one interconnection die 101 is located between the substrate 102 and the substrate 104. The integrated device 103 is located between the substrate 102 and the substrate 104. The integrated device 103 may include a front side and a back side. The front side of the integrated device 103 may face the substrate 102. The back side of the integrated device 103 may face the substrate 104. The back side of the integrated device 103 may be covered by the encapsulation layer 106. In some implementations, the back side (e.g., back side surface) of the integrated device 103 may be left exposed (e.g., not covered by the encapsulation layer 106). The at least one interconnection die 101 is located laterally to the integrated device 103. The at least one interconnection die 101 may laterally surround the integrated device 103.

The at least one interconnection die 101 includes a die substrate 110 and a plurality of die interconnects 112. The die substrate 110 may include silicon. The plurality of die interconnects 112 include a pad interconnect 112*a* (e.g., pad), a via interconnect 112*b* (e.g., via) and a pad interconnect 112*c* (e.g., pad). The pad interconnect 112*a* is coupled to the via interconnect 112*b*. The via interconnect 112*b* is coupled to the pad interconnect 112*c*. The pad interconnect 112*a* is coupled to the solder interconnect 114*a*. The solder interconnect 114*a* is part of the plurality of solder interconnects 114. The plurality of solder interconnects 114 is coupled to the plurality of die interconnects 112. The pad interconnect 112*c* is coupled to the solder interconnect 115*a*. The solder interconnect 115*a* is part of the plurality of solder interconnects 115. The at least one interconnection die 101 may include a dummy die. The at least one interconnection die 101 may be free of active components. The at least one interconnection die 101 may be free of transistors. The at least one interconnection die 101 may be a means for die interconnection.

The pitch of interconnects between the substrate 102 and the substrate 104 may be relatively small. For example, the plurality of die interconnects 112 may have a pitch between neighboring die interconnects in a range of about 150-270 micrometers. These dimensions are possible through the use of the at least one interconnection die 101, which (i) helps provide a package 100 that is thinner while still able to accommodate the integrated device 103 between two substrates, and (ii) helps provide interconnects in an encapsulation layer with low pitches (e.g., 150-270 micrometers), and thus helps provide high-density routing (e.g., high-density interconnects) in an encapsulation layer. The pad interconnect 112*c* may have a diameter and/or a width of about 30-60 micrometers. The pad interconnect 112*b* may have a height of about 30-70 micrometers. The pad interconnect 112*a* may have a diameter and/or a width of about 90-220 micrometers. The pad interconnect 112*a* may have a thickness of about 5-15 micrometers. The encapsulation layer 106 may have a thickness of about 70-150 micrometers. The spacing between the surfaces of the substrate 102 and the substrate 104 may equal to the thickness of the encapsulation layer 106.

The substrate 102 may have a thickness in a range of about 90-160 micrometers. The plurality of interconnects 122 from the substrate 102 may have width in a range of about 6-8 micrometers. The plurality of interconnects 122 from the substrate 102 may have spacing in a range of about 8-10 micrometers. In some implementations, the plurality of interconnects 122 from the substrate 102 may have width and spacing (US) of about 6 micrometers/8 micrometers. In some implementations, the plurality of interconnects 122 from the substrate 102 may have width and spacing (US) of about 8 micrometers/10 micrometers.

The substrate 104 may have a thickness in a range of about 90-160 micrometers. The plurality of interconnects 142 from the substrate 104 may have width in a range of about 6-8 micrometers. The plurality of interconnects 142 from the substrate 104 may have spacing in a range of about 8-10 micrometers. In some implementations, the plurality of interconnects 142 from the substrate 104 may have width and spacing (US) of about 6 micrometers/8 micrometers. In some implementations, the plurality of interconnects 122 from the substrate 104 may have width and spacing (US) of about 8 micrometers/10 micrometers.

It is noted that the above dimensions are exemplary. Different implementations may have interconnects with different dimensions and/or configurations.

The integrated device 105 (e.g., second integrated device) is coupled to a second surface (e.g., top surface) of the substrate 104 through a plurality of solder interconnects 150. For example, the integrated device 105 may be coupled to the plurality of interconnects 142 of the substrate 104 through the plurality of solder interconnects 150. The integrated device 105 may be coupled to the substrate 102 through a plurality of pillar interconnects and/or a plurality of solder interconnects 150. The integrated device 105 may be configured to be electrically coupled to the integrated device 103 through the plurality of solder interconnect 150, the plurality of interconnects 142, the plurality of solder interconnects 114, the at least one interconnection die 101 (a plurality of interconnects 112), the plurality of solder interconnects 115, the plurality of interconnects 122 and/or the plurality of solder interconnects 130.

Figure 2:
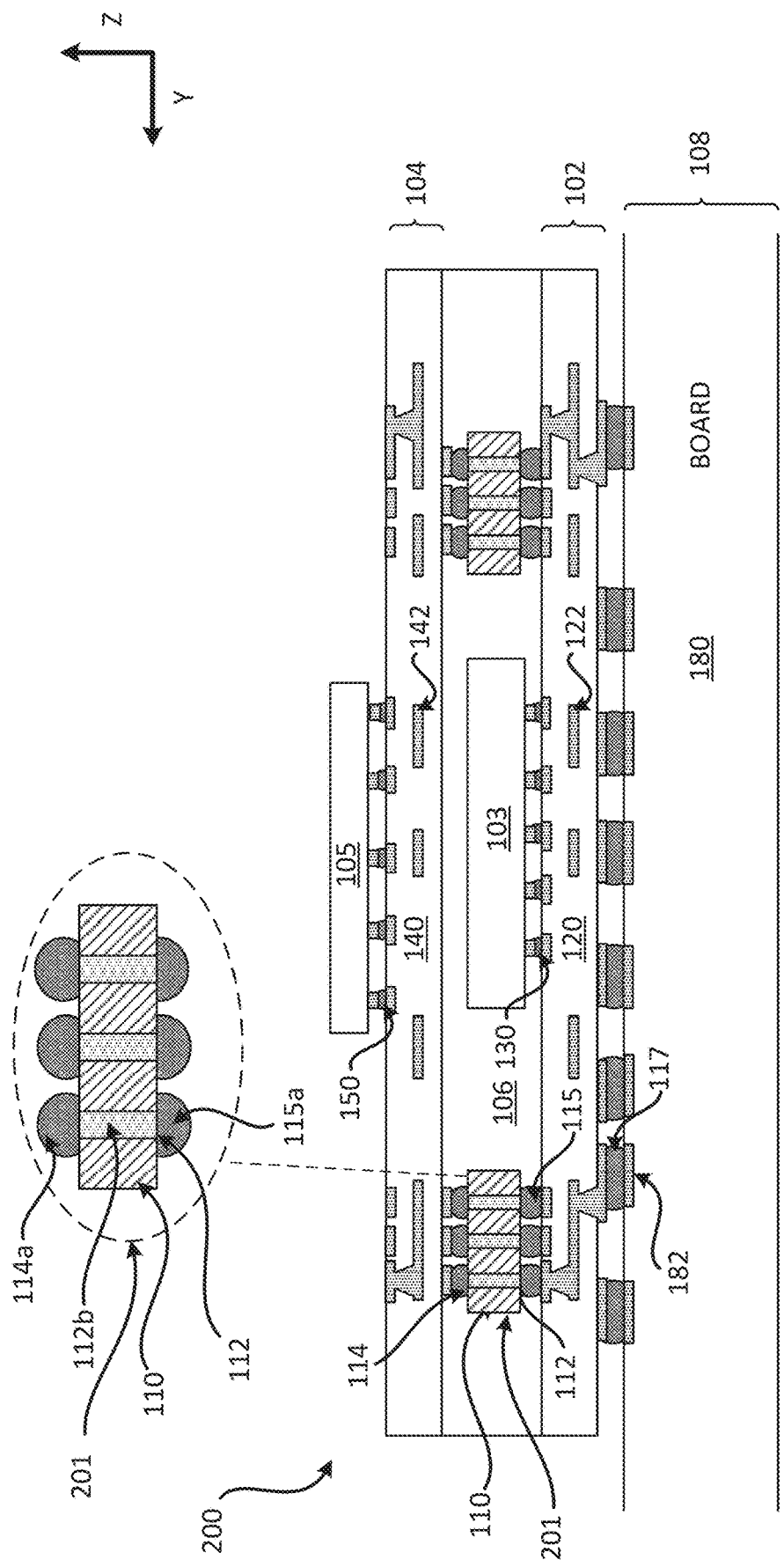
FIG. 2 illustrates an exemplary cross sectional profile view of a package that includes a substrate and at least one interconnection die.

FIG. 2 illustrates a cross sectional profile view of a package 200 that includes a substrate and a high density interconnection. The package 200 is similar to the package 100 of FIG. 1, and thus includes the same or similar components as the package 100. The package 200 includes at least one interconnection die 201 that has a different configuration, arrangement and/or design than the at least one interconnection die 101 of FIG. 1.

The package 200 is coupled to the board 108 through the plurality of solder interconnects 117. The board 108 includes at least one board dielectric layer 180 and the plurality of board interconnects 182. The board 108 may include a printed circuit board (PCB).

The package 200 includes at least one interconnection die 201, the substrate 102, the substrate 104, the integrated device 103, the integrated device 105, and the encapsulation layer 106. The at least one interconnection die 201 is coupled to the second surface (e.g., top surface) of the substrate 102 through the plurality of solder interconnects 114. The substrate 104 (e.g., second substrate) is coupled to the substrate 102 (e.g., first substrate) through the at least one interconnection die 201.

The at least one interconnection die 201 includes the die substrate 110 and the plurality of die interconnects 112. The die substrate 110 may include silicon. The plurality of die interconnects 112 include a via interconnect 112b (e.g., via). In some implementations, the via interconnect 112b of FIG. 2, may have a width and/or diameter of about 100 micrometers. The solder interconnect 114a is coupled to the solder interconnect 114a. The solder interconnect 114a is part of the plurality of solder interconnects 114. The plurality of solder interconnects 114 is coupled to the plurality of die interconnects 112. The via interconnect 112b is coupled to the solder interconnect 115a. The solder interconnect 115a is part of the plurality of solder interconnects 115. The at least one interconnection die 201 may be a dummy die. The at least one interconnection die 201 may be free of active components. The at least one interconnection die 201 may be free of transistors. One possible difference between the at least one interconnection die 201 and the at least one interconnection die 101 is that the at least one interconnection die 201 does not include a pad interconnect 112a, and a pad interconnect 112c. One advantage of not having the pad interconnect 112a and/or the pad interconnect 112c is that the at least one interconnection die 201 may be thinner than the at least one interconnection die 101, which can help reduce the overall thickness of the package. The at least one interconnection die 201 may be a means for die interconnection.

The pitch of interconnects between the substrate 102 and the substrate 104 may be relatively small. For example, the plurality of die interconnects 112 of the at least one interconnection die 201, may have a pitch between neighboring die interconnects in a range of about 150-270 micrometers. These dimensions are possible through the use of the at least one interconnection die 201, which (i) helps provide a package 200 that is thinner while still able to accommodate an integrated device between substrates, and (ii) helps provide interconnects in an encapsulation layer with low pitches (e.g., 150-270 micrometers), and thus helps provide high-density routing (e.g., high-density interconnects) in an encapsulation layer.

The integrated device 105 may be configured to be electrically coupled to the integrated device 103 through the plurality of solder interconnect 150, the plurality of interconnects 142, the plurality of solder interconnects 114, the at least one interconnection die 201 (a plurality of interconnects 112), the plurality of solder interconnects 115, the plurality of interconnects 122 and/or the plurality of solder interconnects 130.

As will be further described below in at least FIGS. 8 and 9, in some implementations, another package (e.g., second package) may be coupled to the packages described in FIGS. 1 and 2. Thus, for example, as will be further described below, a package with an interconnection die may be a package on package (PoP) that includes a first package and a second package on top of the first package.

An integrated device (e.g., 103, 105, 805) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 103, 105) may include at least one electronic circuit (e.g., first electronic circuit, second electronic circuit, etc. . . . ). An integrated device may include transistors. An integrated device may be an example of an electrical component and/or electrical device. In some implementations, an integrated device may be a chiplet. A chiplet may be fabricated using one or more processes that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that perform several functions may reduce the overall cost of a package relative to using a single chip to perform all of the functions of a package.

The package (e.g., 100, 200, 800, 900) may be implemented in a radio frequency (RF) package. The RF package may be a radio frequency front end (RFFE) package. A package (e.g., 100, 200) may be configured to provide Wireless Fidelity (WiFi) communication and/or cellular communication (e.g., 2G, 3G, 4G, 5G). The packages (e.g., 100, 300) may be configured to support Global System for Mobile (GSM) Communications, Universal Mobile Telecommunications System (UMTS), and/or Long-Term Evolution (LTE). The packages (e.g., 100, 200) may be configured to transmit and receive signals having different frequencies and/or communication protocols.

Having described various interconnection die, a sequence for fabricating an interconnection die will now be described below.

Exemplary Sequence for Fabricating an Interconnection Die

Figure 3:
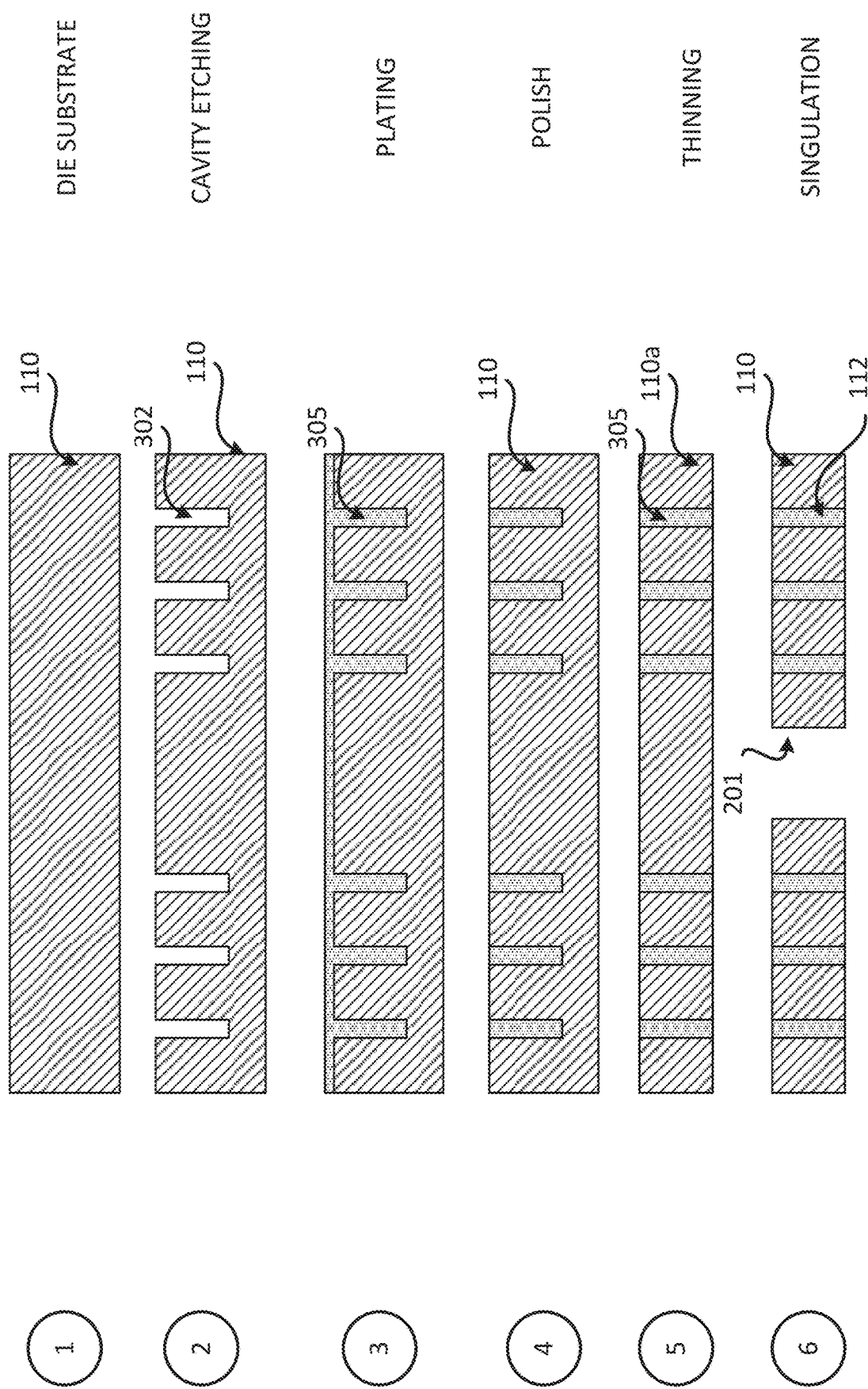
FIG. 3 illustrates an exemplary sequence for fabricating an interconnection die.

In some implementations, fabricating an interconnection die includes several processes. FIG. 3 illustrates an exemplary sequence for providing or fabricating an interconnection die. In some implementations, the sequence of FIG. 3 may be used to provide or fabricate the interconnection die 201. However, the process of FIG. 3 may be used to fabricate any of the interconnection die (e.g., 101) described in the disclosure.

It should be noted that the sequence of FIG. 3 may combine one or more stages in order to simplify and/or clarify the sequence for providing or fabricating an interconnection die. In some implementations, the order of the processes may be changed or modified. In some implementations, one or more of processes may be replaced or substituted without departing from the scope of the disclosure.

Stage 1, as shown in FIG. 3, illustrates a state after a die substrate 110 is provided. The die substrate 110 includes silicon. The die substrate 110 may include a first surface and a second surface. In some implementations, the first surface of the die substrate 110 may be a top surface and the second surface of the die substrate 110 may be a bottom surface. In some implementations, the first surface of the die substrate 110 may be a bottom surface and the second surface of the die substrate 110 may be a top surface.

Stage 2 illustrates a state after a plurality of cavities 302 are formed in the die substrate 110. For example, the plurality of cavities 302 may be formed through the first surface of the die substrate 110. The plurality of cavities 302 may include trenches. The plurality of cavities 302 may extend partially through the thickness of the die substrate 110. A laser ablation process and/or an etching process may be used to form the plurality of cavities 302.

Stage 3 illustrates after a metal layer 305 is formed in the plurality of cavities 302 and/or over the first surface of the die substrate 110. The metal layer 305 may include copper. A plating process may be used to form the metal layer 305.

Stage 4 illustrates a state after portions of the metal layer 305 are removed. For example, portions of the metal layer 305 that are coupled to the first surface of the die substrate 110 may be removed, leaving the metal layer 305 in the plurality of cavities 302. A polishing process may be used to remove portions of the metal layer 305. The remaining metal from the metal layer 305 that is located in the plurality of cavities 302 may define a plurality of interconnects 112b, as described in FIG. 1 and FIG. 2.

Stage 5 illustrates a state after the die substrate 110 is thinned. For example, portions (e.g., bottom portions) of the die substrate 110 may be removed, leaving at least the die substrate 110a, which exposes the bottom side of the metal layer 305. A grinding process may be used to remove portions of the die substrate 110.

Stage 6 illustrates a state after singulation to form several interconnection dies. A mechanical process may be used to singulate the die substrate 110 into several interconnection dies (e.g., 101, 201). A saw may be used to singulate the die substrate 110. In some implementations, Stage 6 may illustrate one implementation of an interconnection die that includes interconnects, and no additional interconnects are formed in, above or below the die substrate 110.

Exemplary Sequence for Fabricating an Interconnection Die

Figure 4:
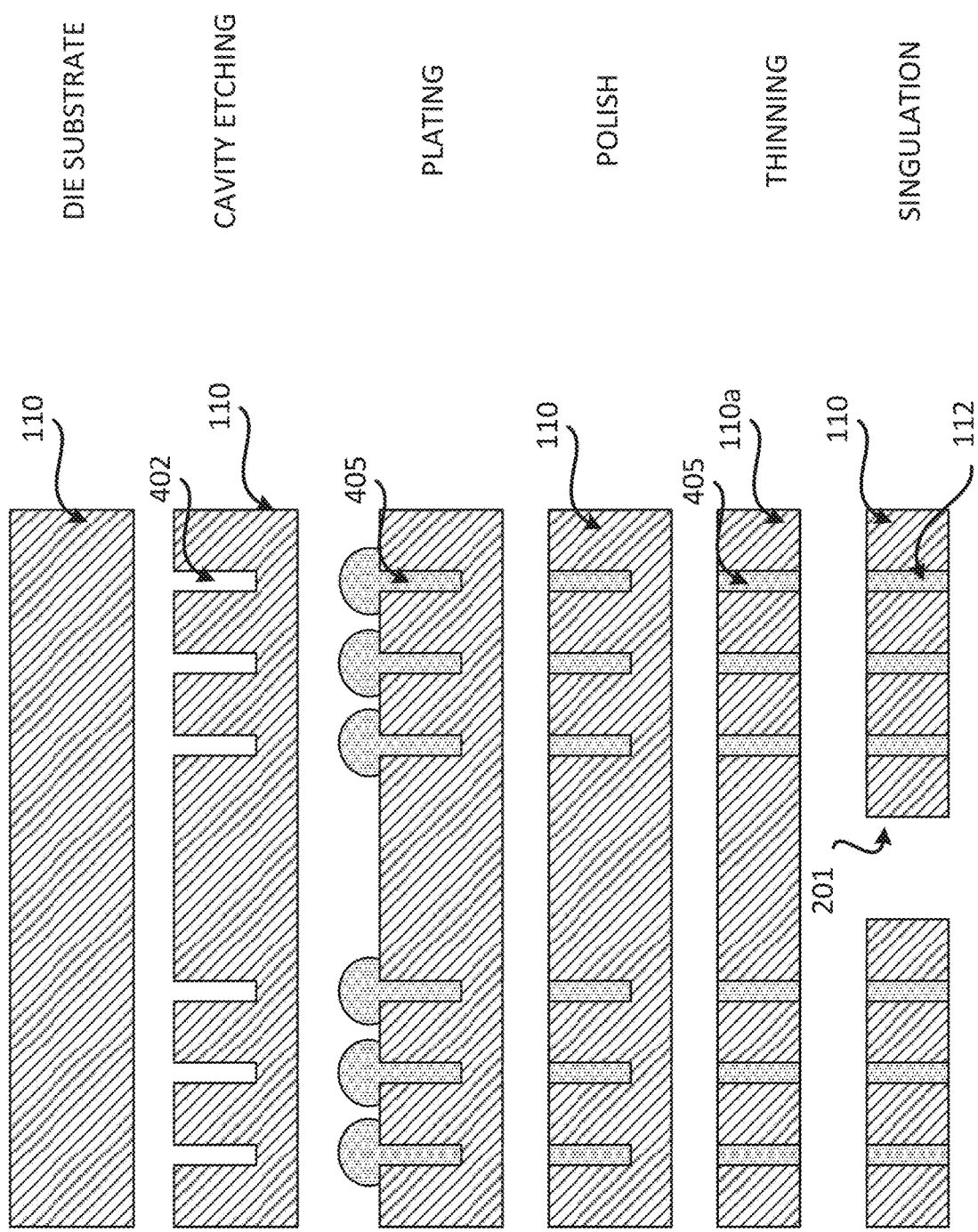
FIG. 4 illustrates an exemplary sequence for fabricating an interconnection die.

In some implementations, fabricating an interconnection die includes several processes. FIG. 4 illustrate an exemplary sequence for providing or fabricating an interconnection die. In some implementations, the sequence of FIG. 4 may be used to provide or fabricate the interconnection die 201. However, the process of FIG. 4 may be used to fabricate any of the interconnection die (e.g., 101) described in the disclosure.

It should be noted that the sequence of FIG. 4 may combine one or more stages in order to simplify and/or clarify the sequence for providing or fabricating an interconnection die. In some implementations, the order of the processes may be changed or modified. In some implementations, one or more of processes may be replaced or substituted without departing from the scope of the disclosure.

Stage 1, as shown in FIG. 4, illustrates a state after a die substrate 110 is provided. The die substrate 110 includes silicon. The die substrate 110 may include a first surface and a second surface. In some implementations, the first surface of the die substrate 110 may be a top surface and the second surface of the die substrate 110 may be a bottom surface. In some implementations, the first surface of the die substrate 110 may be a bottom surface and the second surface of the die substrate 110 may be a top surface.

Stage 2 illustrates a state after a plurality of cavities 402 are formed in the die substrate 110. For example, the plurality of cavities 402 may be formed through the first surface of the die substrate 110. The plurality of cavities 402 may include trenches. The plurality of cavities 402 may extend partially through the thickness of the die substrate 110. A laser ablation process and/or an etching process may be used to form the plurality of cavities 402.

Stage 3 illustrates after a metal layer 405 is formed in the plurality of cavities 402 and/or over the first surface of the die substrate 110. The metal layer 405 may include copper. A fill process may be used to form the metal layer 405, where a conductive paste may be used to fill the plurality of cavities 402. Additional metal layer 405 may be located over the die substrate 110.

Stage 4 illustrates a state after portions of the metal layer 405 are removed. For example, portions of the metal layer 405 that are coupled to the first surface of the die substrate 110 may be removed, leaving the metal layer 405 in the plurality of cavities 402. A polishing process may be used to remove portions of the metal layer 405. The remaining metal from the metal layer 405 that is located in the plurality of cavities 402 may define a plurality of interconnects 112b, as described in FIG. 1 and FIG. 2.

Stage 5 illustrates a state after the die substrate 110 is thinned. For example, portions (e.g., bottom portions) of the die substrate 110 may be removed, leaving at least the die substrate 110a, which exposes the bottom side of the metal layer 405. A grinding process may be used to remove portions of the die substrate 110.

Stage 6 illustrates a state after singulation to form several interconnection dies. A mechanical process may be used to singulate the die substrate 110 into several interconnection dies (e.g., 101, 201). A saw may be used to singulate the die substrate 110. In some implementations, Stage 6 may illustrate one implementation of an interconnection die that includes interconnects, and no additional interconnects are formed in, above or below the die substrate 110.

Exemplary Sequence for Fabricating an Interconnection Die

Figure 5A:
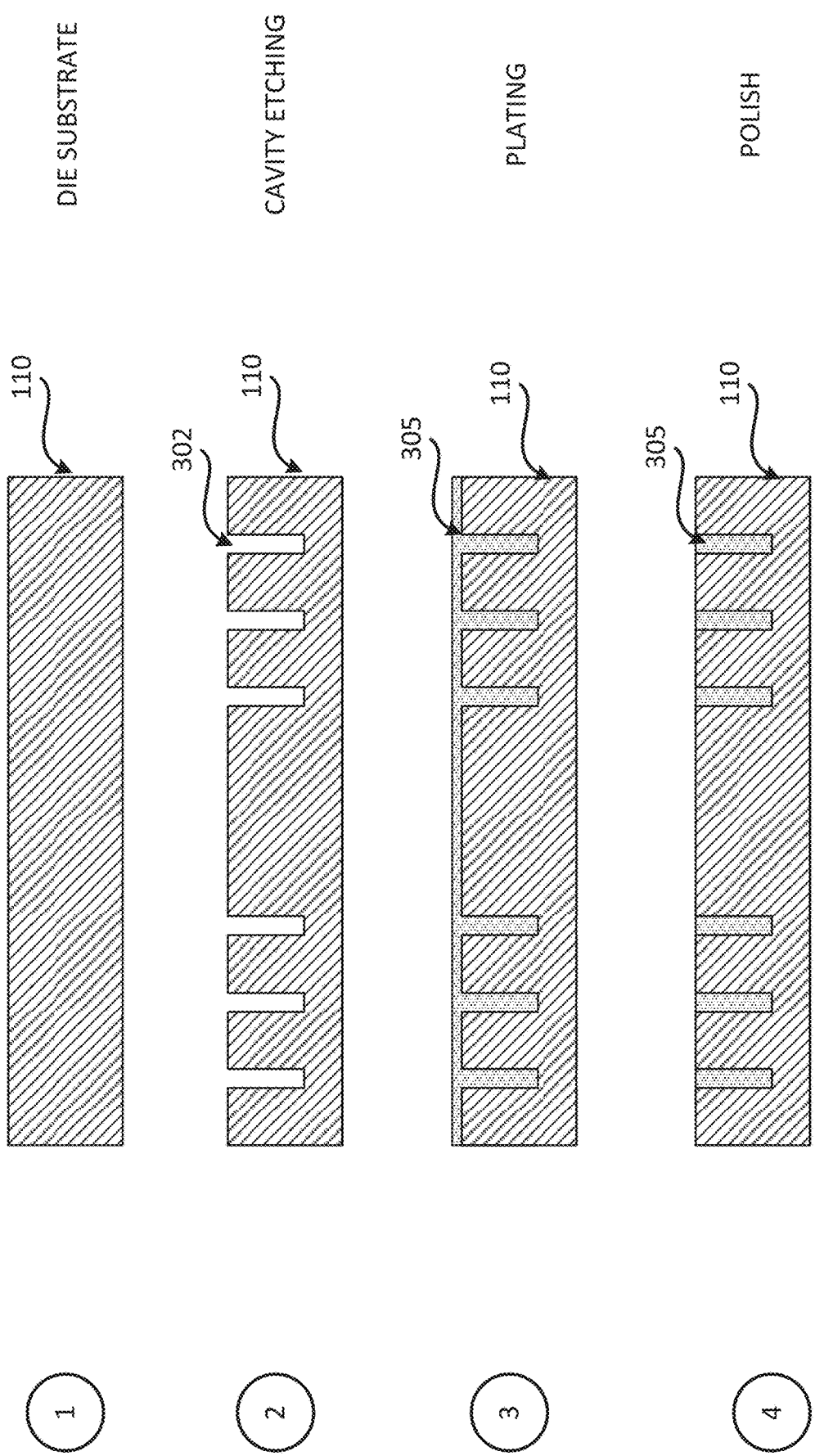
FIGS. 5A-5B illustrate an exemplary sequence for fabricating an interconnection die.
Figure 5B:
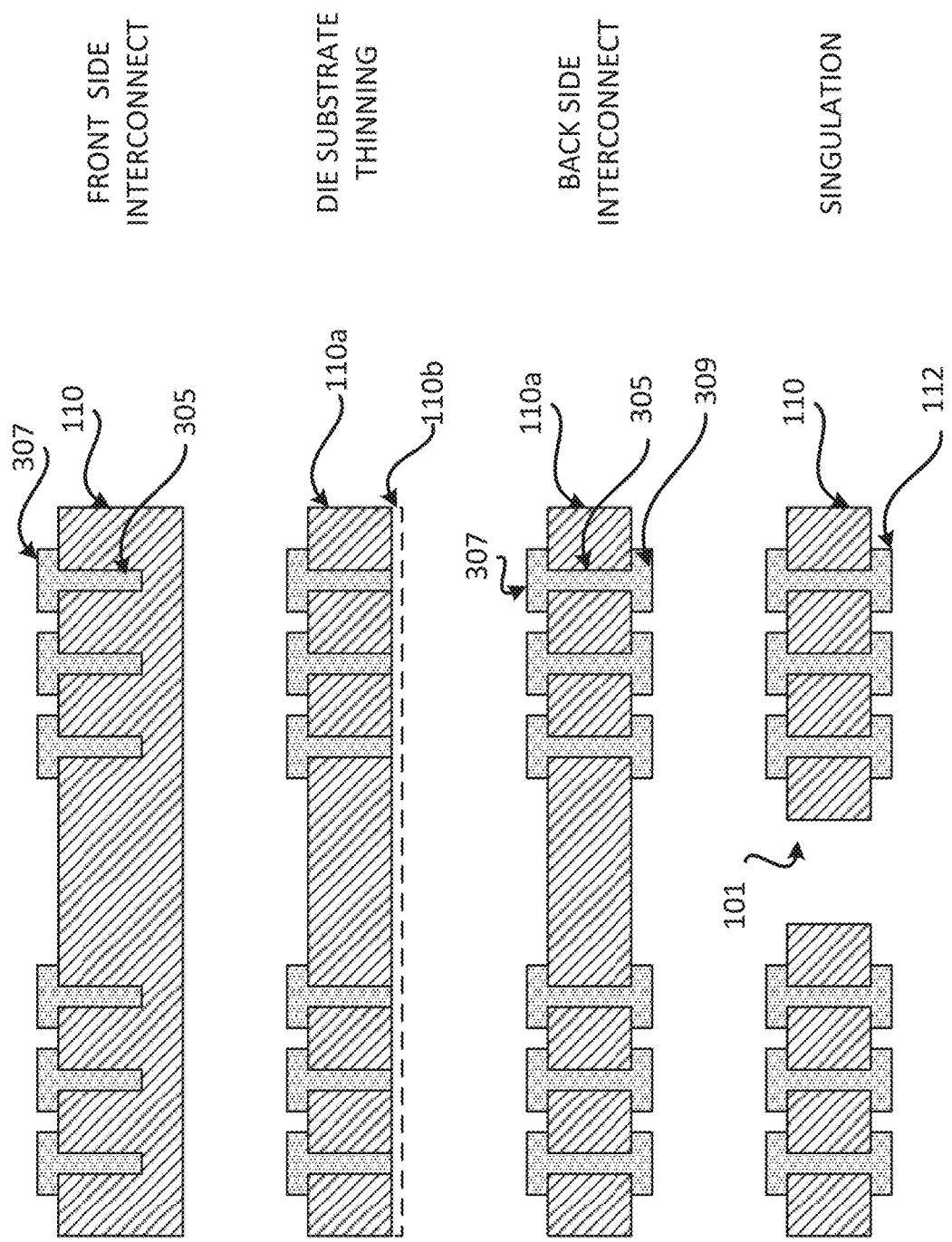

In some implementations, fabricating an interconnection die includes several processes. FIGS. 5A-5B illustrate an exemplary sequence for providing or fabricating an interconnection die. In some implementations, the sequence of FIGS. 5A-5B may be used to provide or fabricate the interconnection die 101. However, the process of FIGS. 5A-5B may be used to fabricate any of the interconnection die (e.g., 201) described in the disclosure.

It should be noted that the sequence of FIGS. 5A-5B may combine one or more stages in order to simplify and/or clarify the sequence for providing or fabricating an interconnection die. In some implementations, the order of the processes may be changed or modified. In some implementations, one or more of processes may be replaced or substituted without departing from the scope of the disclosure.

Stage 1, as shown in FIG. 5A, illustrates a state after a die substrate 110 is provided. The die substrate 110 includes silicon. The die substrate 110 may include a first surface and a second surface. In some implementations, the first surface of the die substrate 110 may be a top surface and the second surface of the die substrate 110 may be a bottom surface. In some implementations, the first surface of the die substrate 110 may be a bottom surface and the second surface of the die substrate 110 may be a top surface.

Stage 2 illustrates a state after a plurality of cavities 302 are formed in the die substrate 110. For example, the plurality of cavities 302 may be formed through the first surface of the die substrate 110. The plurality of cavities 302 may include trenches. The plurality of cavities 302 may extend partially through the thickness of the die substrate 110. A laser ablation process and/or an etching process may be used to form the plurality of cavities 302.

Stage 3 illustrates after a metal layer 305 is formed in the plurality of cavities 302 and/or over the first surface of the die substrate 110. The metal layer 305 may include copper. A plating process may be used to form the metal layer 305.

Stage 4 illustrates a state after portions of the metal layer 305 are removed. For example, portions of the metal layer 305 that are coupled to the first surface of the die substrate 110 may be removed, leaving the metal layer 305 in the plurality of cavities 302. A polishing process may be used to remove portions of the metal layer 305. The remaining metal from the metal layer 305 that is located in the plurality of cavities 302 may define a plurality of interconnects 112b, as described in FIG. 1 and FIG. 2.

Stage 5, as shown in FIG. 5B, illustrates a state after a metal layer 307 is formed over the first surface of the die substrate 110. A plating process may be used to form the metal layer 307. The metal layer 307 may be coupled to the metal layer 305. The metal layer 307 may define a plurality of interconnects 112b, as described in FIG. 1 and FIG. 2. The metal layer 307 may represent the front side interconnects of an interconnection die.

Stage 6 illustrates a state after the die substrate 110 is thinned. For example, portions (e.g., bottom portions) of the die substrate 110 may be removed, leaving at least the die substrate 110a, which exposes the bottom side of the metal layer 305. In some implementations, portions of the die substrate 110 may be removed, leaving at least the die substrate 110a and the die substrate 110b. When the die substrate 110b is present, the bottom side of the metal layer 305 is not exposed. A grinding process may be used to remove portions (e.g., bottom portions) of the die substrate 110. In some implementations. Stage 6 may illustrate one implementation of interconnection die that includes interconnects, and no additional interconnects are formed in, above or below the die substrate 110. If no further interconnects are formed, singulation may occur in a similar manner as described below at Stage 8. As will be further described below, the interconnection die that is shown in Stage 6 may be used to couple to a substrate.

Stage 7 illustrates a state after a metal layer 309 is formed over the second surface of the die substrate 110. A plating process may be used to form the metal layer 309. The metal layer 309 may be coupled to the metal layer 305. The metal layer 307 may define a plurality of interconnects 112c, as described in FIG. 1 and FIG. 2. The metal layer 309 may represent the back side interconnects of an interconnection die.

Stage 8 illustrates a state after singulation to form several interconnection dies. A mechanical process may be used to singulate the die substrate 110 into several interconnection dies (e.g., 101, 201). A saw may be used to singulate the die substrate 110.

Exemplary Sequence for Fabricating an Interconnection Die

Figure 6A:
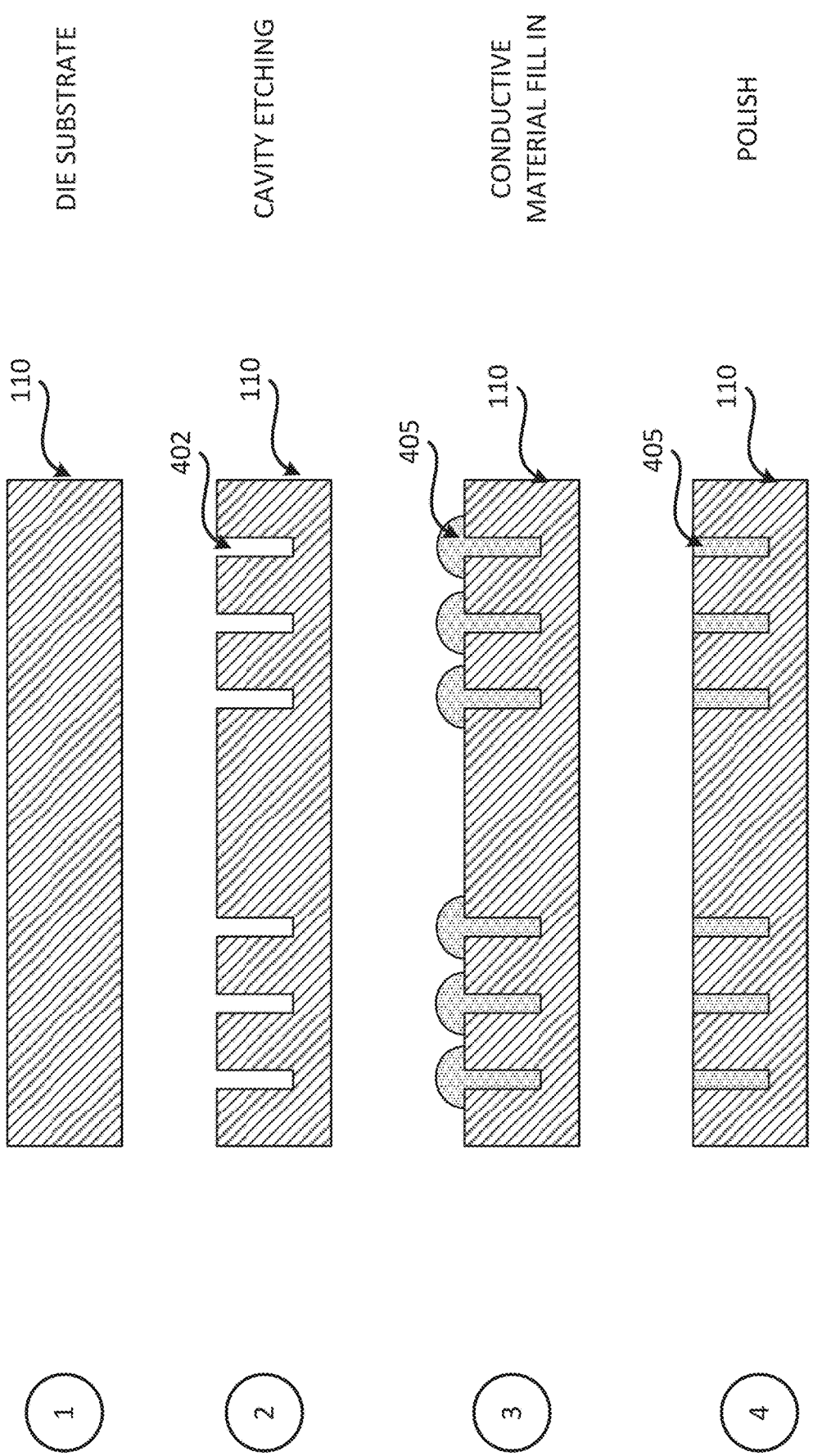
FIGS. 6A-6B illustrate an exemplary sequence for fabricating an interconnection die.
Figure 6B:
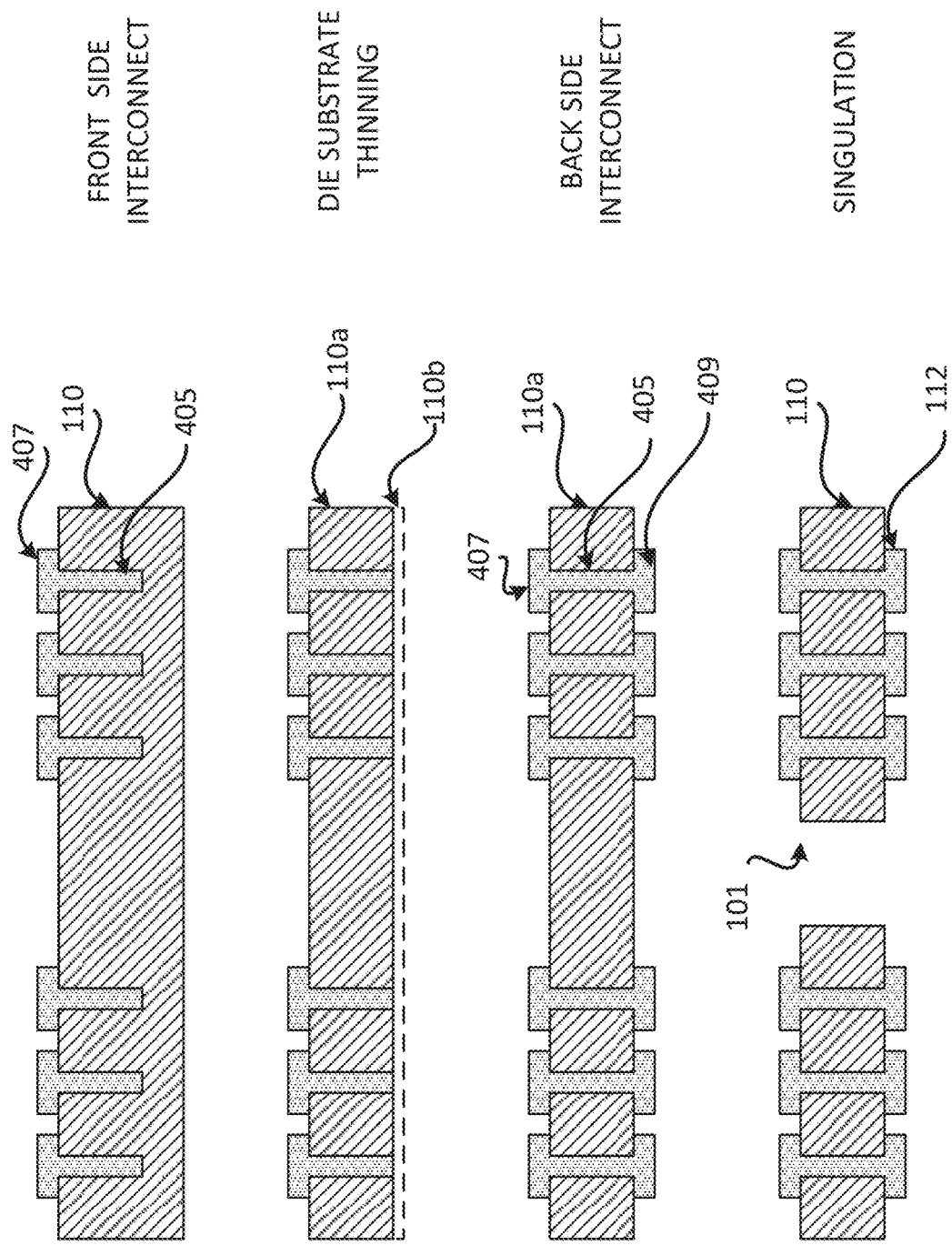

In some implementations, fabricating an interconnection die includes several processes. FIGS. 6A-6B illustrate an exemplary sequence for providing or fabricating an interconnection die. In some implementations, the sequence of FIGS. 6A-6B may be used to provide or fabricate the interconnection die 101. However, the process of FIGS. 6A-6B may be used to fabricate any of the interconnection die (e.g., 201) described in the disclosure.

It should be noted that the sequence of FIGS. 6A-6B may combine one or more stages in order to simplify and/or clarify the sequence for providing or fabricating an interconnection die. In some implementations, the order of the processes may be changed or modified. In some implementations, one or more of processes may be replaced or substituted without departing from the scope of the disclosure.

Stage 1, as shown in FIG. 6A, illustrates a state after a die substrate 110 is provided. The die substrate 110 includes silicon. The die substrate 110 may include a first surface and a second surface. In some implementations, the first surface of the die substrate 110 may be a top surface and the second surface of the die substrate 110 may be a bottom surface. In some implementations, the first surface of the die substrate 110 may be a bottom surface and the second surface of the die substrate 110 may be a top surface.

Stage 2 illustrates a state after a plurality of cavities 402 are formed in the die substrate 110. For example, the plurality of cavities 402 may be formed through the first surface of the die substrate 110. The plurality of cavities 402 may include trenches. The plurality of cavities 402 may extend partially through the thickness of the die substrate 110. A laser ablation process and/or an etching process may be used to form the plurality of cavities 402.

Stage 3 illustrates after a metal layer 405 is formed in the plurality of cavities 402 and/or over the first surface of the die substrate 110. The metal layer 405 may include copper. A fill process may be used to form the metal layer 405, where a conductive paste may be used to fill the plurality of cavities 402. The metal layer 405 may be located over the die substrate 110.

Stage 4 illustrates a state after portions of the metal layer 405 are removed. For example, portions of the metal layer 405 that are coupled to the first surface of the die substrate 110 may be removed, leaving the metal layer 405 in the plurality of cavities 402. A polishing process may be used to remove portions of the metal layer 405. The remaining metal from the metal layer 405 that is located in the plurality of cavities 402 may define a plurality of interconnects 112b, as described in FIG. 1 and FIG. 2.

Stage 5, as shown in FIG. 6B, illustrates a state after a metal layer 407 is formed over the first surface of the die substrate 110. A plating process may be used to form the metal layer 407. The metal layer 407 may be coupled to the metal layer 405. The metal layer 407 may define a plurality of interconnects 112a, as described in FIG. 1 and FIG. 2. The metal layer 407 may represent the front side interconnects of an interconnection die.

Stage 6 illustrates a state after the die substrate 110 is thinned. For example, portions (e.g., bottom portions) of the die substrate 110 may be removed, leaving at least the die substrate 110a, which exposes the bottom side of the metal layer 405. In some implementations, portions of the die substrate 110 may be removed, leaving at least the die substrate 110a and the die substrate 110b. When the die substrate 110b is present, the bottom side of the metal layer 405 is not exposed. A grinding process may be used to remove portions (e.g., bottom portions) of the die substrate 110. In some implementations, Stage 6 may illustrate one implementation of interconnection die that includes interconnects, and no additional interconnects are formed in, above or below the die substrate 110. If no further interconnects are formed, singulation may occur in a similar manner as described below at Stage 8. As will be further described below, the interconnection die that is shown in Stage 6 may be used to couple to a substrate.

Stage 7 illustrates a state after a metal layer 409 is formed over the second surface of the die substrate 110. A plating process may be used to form the metal layer 409. The metal layer 409 may be coupled to the metal layer 405. The metal layer 409 may define a plurality of interconnects 112c, as described in FIG. 1 and FIG. 2. The metal layer 409 may represent the back side interconnects of an interconnection die.

Stage 8 illustrates a state after singulation to form several interconnection dies. A mechanical process may be used to singulate the die substrate 110 into several interconnection dies (e.g., 101, 201). A saw may be used to singulate the die substrate 110.

Exemplary Flow Diagram of a Method for Fabricating an Interconnection Die

Figure 7:
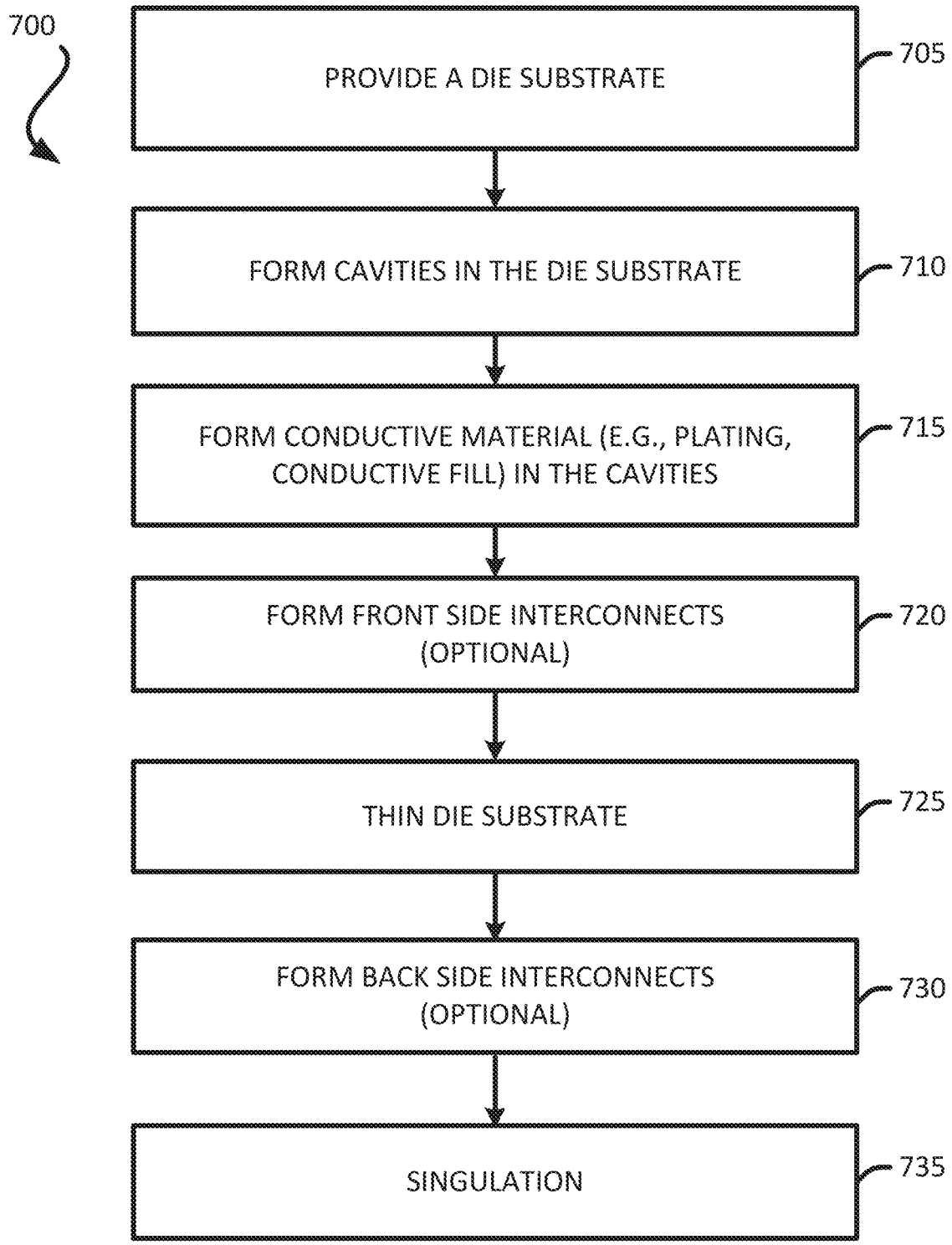
FIG. 7 illustrates an exemplary flow chart of a method for fabricating an interconnection die.

In some implementations, fabricating an interconnection die includes several processes. FIG. 7 illustrates an exemplary flow diagram of a method 700 for providing or fabricating an interconnection die. In some implementations, the method 700 of FIG. 7 may be used to provide or fabricate the interconnection die 101 described in the disclosure. However, the method 700 may be used to provide or fabricate any of the interconnection die (e.g., 201) described in the disclosure.

It should be noted that the method 700 of FIG. 7 may combine one or more processes in order to simplify and/or clarify the method for providing or fabricating an interconnection die. In some implementations, the order of the processes may be changed or modified.

The method provides (at 705) a die substrate (e.g., 110). The die substrate 110 includes silicon. The die substrate 110 may include a first surface and a second surface. In some implementations, the first surface of the die substrate 110 may be a top surface and the second surface of the die substrate 110 may be a bottom surface. In some implementations, the first surface of the die substrate 110 may be a bottom surface and the second surface of the die substrate 110 may be a top surface. Stage 1 of FIG. 5A illustrates and describes an example of providing a die substrate. Stage 1 of FIG. 6A illustrates and describes an example of providing a die substrate.

The method forms (at 710) a plurality of cavities (e.g., 302, 402) in the die substrate 110. For example, the plurality of cavities (e.g., 302, 402) may be formed through the first surface of the die substrate 110. The plurality of cavities (e.g., 302, 402) may include trenches. The plurality of cavities (e.g., 302, 402) may extend partially through the thickness of the die substrate 110. A laser ablation process and/or an etching process may be used to form the plurality of cavities (e.g., 302, 402). Stage 2 of FIG. 5A illustrates and describes an example of forming cavities in a die substrate. Stage 2 of FIG. 6A illustrates and describes an example of forming cavities in a die substrate.

The method forms (at 715) a conductive material (e.g., electrically conductive material) in the plurality of cavities (e.g., 302, 402) of the die substrate 110. The conductive material may include a metal layer (e.g., 305, 405). The conductive material may be formed over the surface of the die substrate 110. The conductive material may include copper. A plating process may be used to form the conductive material. A fill process may be used to form the conductive material. Stage 3 of FIG. 5A illustrates and describes an example of forming conductive materials in a die substrate. Stage 3 of FIG. 6A illustrates and describes an example of forming conductive materials in a die substrate. In some implementations forming the conductive material may include removing portions of the conductive material. A polishing process may be used to remove portions of the conductive material. Removing portions of the conductive material may include removing portions of the conductive material that is coupled to the first surface of the die substrate 110 and leaving the conductive material that is located in the plurality of cavities (e.g., 302, 402) of the die substrate 110. Stage 4 of FIG. 5A illustrates and describes an example of removing portions of conductive materials in a die substrate. Stage 4 of FIG. 6A illustrates and describes an example of removing portions of conductive materials in a die substrate.

The method optionally forms (at 720) a plurality of front side interconnects. The front side interconnects may be coupled to the top side of the die substrate 110. The plurality of front side interconnects may be defined by a patterned metal layer (e.g., 307, 407) on a top surface of the die substrate 110. A plating process may be used to form the metal layer (e.g., 307, 407). The metal layer 307 may be coupled to the metal layer 305. The metal layer 407 may be coupled to the metal layer 405. The metal layer 407 may define a plurality of interconnects 112a, as described in FIG. 1 and FIG. 2. The metal layer 407 may represent the front side interconnects of an interconnection die. The plurality of interconnects 112a may represent the plurality of front side interconnects of an interconnection die. Stage 5 of FIG. 5B illustrates and describes an example of forming front side interconnects. Stage 5 of FIG. 6B illustrates and describes an example of forming front side interconnects.

The method thins (at 725) the die substrate (e.g., 110). Different implementations may thin the die substrate 110 differently. For example, some implementations may thin the die substrate 110 such that a bottom side of the metal layer (e.g., 305, 405) is exposed. Some implementations may thin the die substrate 110 without exposing the bottom side of the metal layer (e.g., 305, 405). A grinding process may be used to remove portions (e.g., bottom portions) of the die substrate 110. Stage 6 of FIG. 5B illustrates and describes an example of thinning a die substrate. Stage 6 of FIG. 6B illustrates and describes an example of thinning a die substrate.

The method optionally forms (at 730) a plurality of back side interconnects. The back side interconnects may be coupled to the bottom side of the die substrate 110. The plurality of back side interconnects may be defined by a patterned metal layer (e.g., 309, 409) on a bottom surface of the die substrate 110. A plating process may be used to form the metal layer (e.g., 309, 409). The metal layer 309 may be coupled to the metal layer 305. The metal layer 409 may be coupled to the metal layer 405. The metal layer 409 may define a plurality of interconnects 112c, as described in FIG. 1 and FIG. 2. The metal layer 409 may represent the back side interconnects of an interconnection die. The plurality of interconnects 112c may represent the plurality of back side interconnects of an interconnection die. Stage 7 of FIG. 5B illustrates and describes an example of forming back side interconnects. Stage 7 of FIG. 6B illustrates and describes an example of forming back side interconnects.

The method singulates (at 735) the die substrate 110 to form several interconnection dies (e.g., 101, 201). A mechanical process may be used to singulate the die substrate 110 into several interconnection dies (e.g., 101, 201). A saw may be used to singulate the die substrate 110. Stage 8 of FIG. 5B illustrates and describes an example of singulation. Stage 8 of FIG. 6B illustrates and describes an example of singulation.

Exemplary Packages Comprising an Interconnection Die

Figure 8:
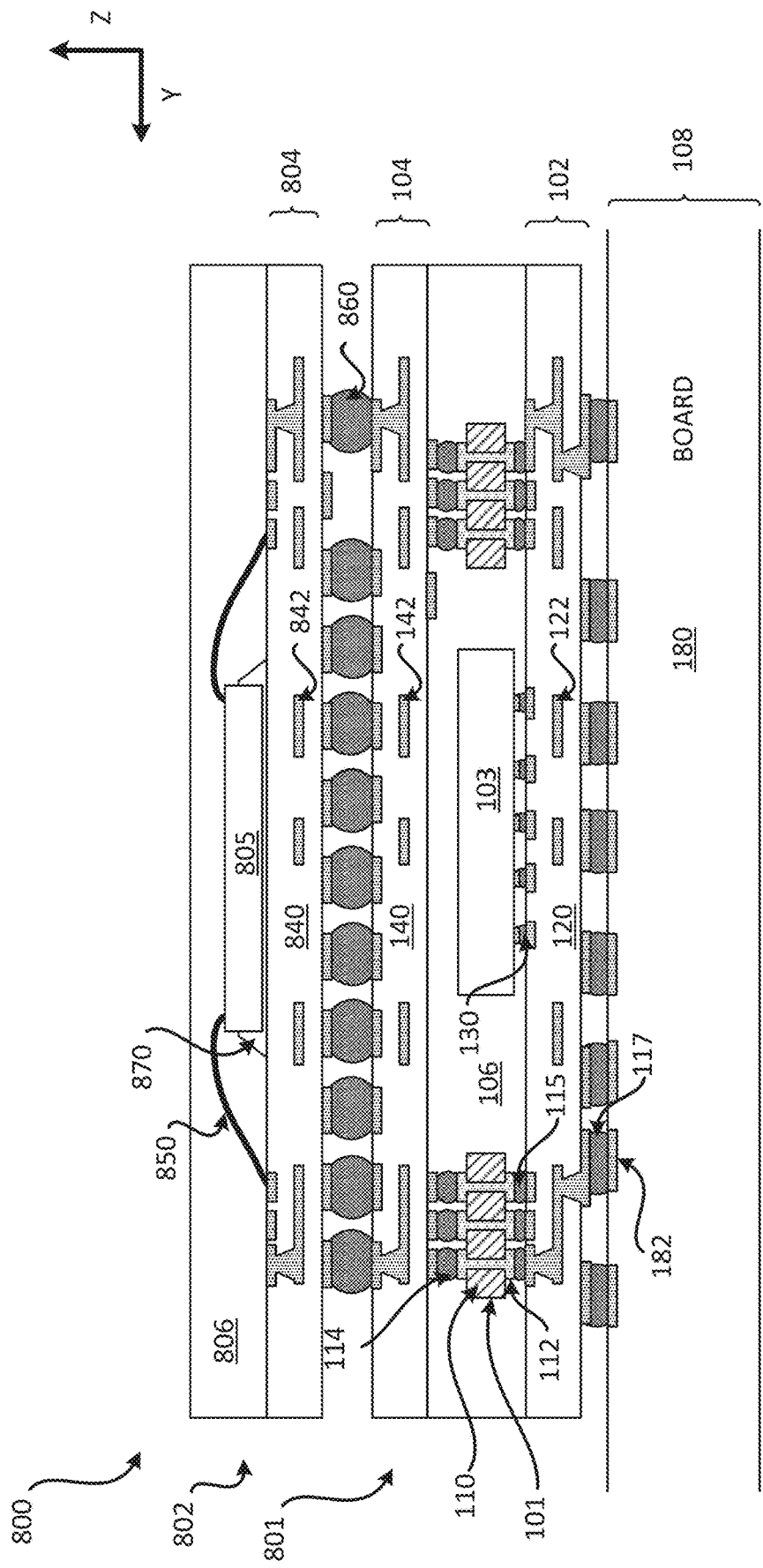
FIG. 8 illustrates an exemplary cross sectional profile view of a package that includes at least one interconnection die.

FIG. 8 illustrates a cross sectional profile view of a package 800 that includes a high density interconnection. The package 800 may include a package on package (PoP). The package 800 includes a package 801 and a package 802. The package 801 may be a first package and the package 802 may be a second package. The package 802 is coupled to the package 801 through a plurality of solder interconnects 860. The package 800 is coupled to the board 108 through the plurality of solder interconnects 117. The board 108 includes at least one board dielectric layer 180 and a plurality of board interconnects 182. The board 108 may include a printed circuit board (PCB). The package 800 is coupled to the plurality of board interconnects 182 of the board 108 through the plurality of solder interconnects 117.

The package 801 may be similar to the package 100 of FIG. 1. The package 801 may be configured and/or arranged in a similar manner as described for the package 100 of FIG. 1. The package 801 includes at least one interconnection die 101, the substrate 102, the substrate 104, the integrated device 103 and the encapsulation layer 106. The substrate 102 includes at least one dielectric layer 120 and a plurality of interconnects 122. The substrate 102 (e.g., first substrate) includes a first surface (e.g., bottom surface) and a second surface (e.g., top surface). The substrate 104 (e.g., second substrate) includes at least one dielectric layer 140 and a plurality of interconnects 142. The substrate 104 includes a first surface (e.g., bottom surface) and a second surface (e.g., top surface). The substrate 104 (e.g., second substrate) is coupled to the substrate 102 (e.g., first substrate) through the at least one interconnection die 101.

The package 802 includes a substrate 804, an integrated device 805, a plurality of wire bonds 850, an adhesive 870, and an encapsulation layer 806. The substrate 804 (e.g., third substrate) includes at least one dielectric layer 840 and a plurality of interconnects 842. The integrated device 805 is coupled to the substrate 804 through the adhesive 870. The plurality of wire bonds 850 is coupled to the integrated device 805 and the plurality of interconnects 842 of the substrate 804. The integrated device 805 may include a memory die. In some implementations, there may be several integrated devices 805 that are stacked on top of each other. The encapsulation layer 806 encapsulates the integrated device 805 and the plurality of wire bonds 850. The encapsulation layer 806 is coupled to the substrate 804 and the integrated device 805. The encapsulation layer 806 is located over the substrate 804 and the integrated device 805. The encapsulation layer 806 may include a mold, a resin and/or an epoxy. The encapsulation layer 806 may be a means for encapsulation. The encapsulation layer 806 may be provided by using a compression and transfer molding process, a sheet molding process, or a liquid molding process. The encapsulation layer 806 may be similar or the same as the encapsulation layer 106.

The integrated device 805 may be configured to be electrically coupled to the integrated device 103 through the plurality of wire bonds 850, the plurality of interconnects 842, the plurality of solder interconnects 860, the plurality of interconnects 142, the plurality of solder interconnects 114, the at least one interconnection die 101 (a plurality of interconnects 112), the plurality of solder interconnects 115, the plurality of interconnects 122 and/or the plurality of solder interconnects 130.

Figure 9:
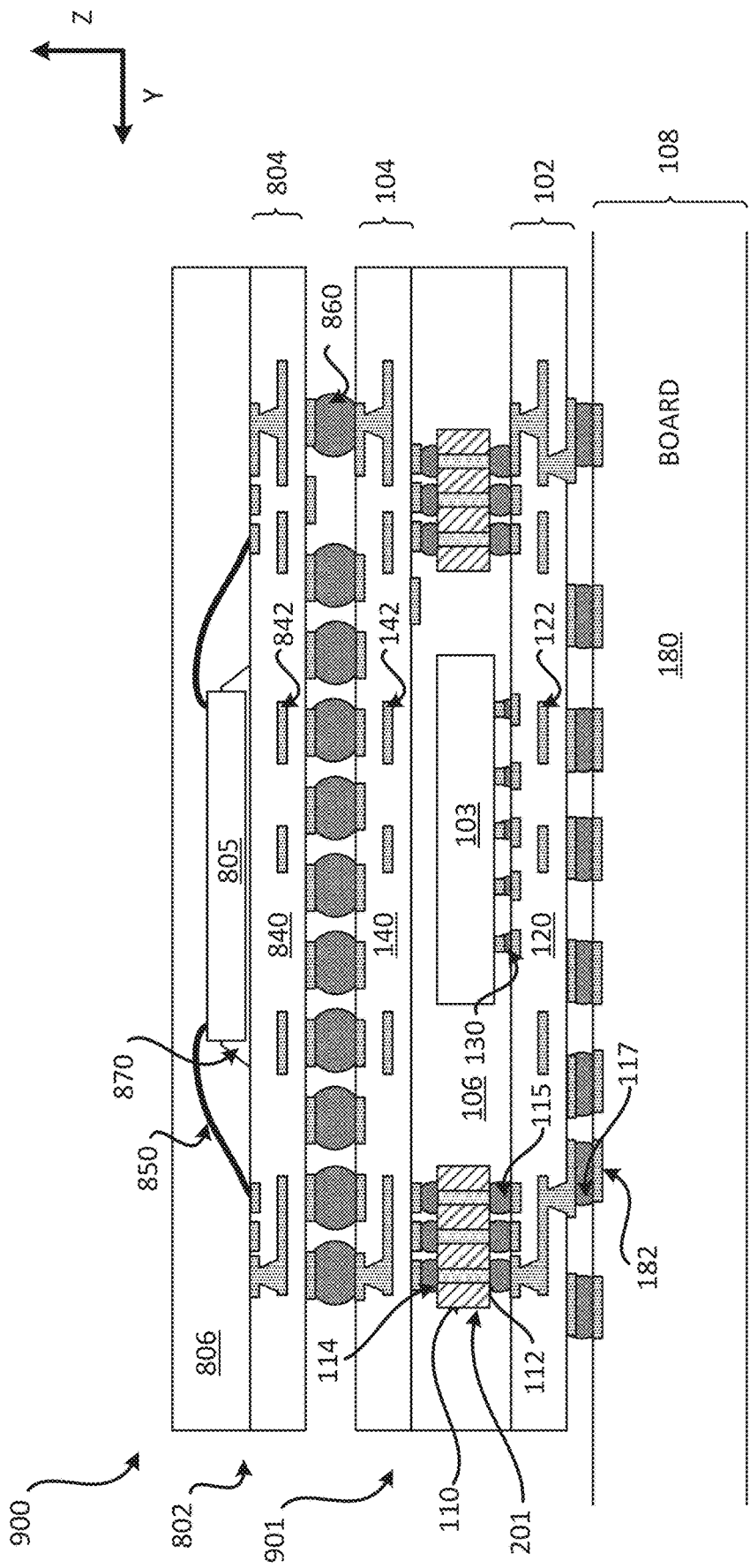
FIG. 9 illustrates an exemplary cross sectional profile view of a package that includes at least one interconnection die.

FIG. 9 illustrates a cross sectional profile view of a package 900 that includes a high density interconnection. The package 900 may include a package on package (PoP). The package 800 includes a package 901 and the package 802. The package 901 may be a first package and the package 802 may be a second package. The package 802 is coupled to the package 901 through a plurality of solder interconnects 860. The package 900 is coupled to the board 108 through the plurality of solder interconnects 117. The board 108 includes at least one board dielectric layer 180 and a plurality of board interconnects 182. The board 108 may include a printed circuit board (PCB). The package 900 is coupled to the plurality of board interconnects 182 of the board 108 through the plurality of solder interconnects 117.

The package 901 may be similar to the package 200 of FIG. 2. The package 901 may be configured and/or arranged in a similar manner as described for the package 200 of FIG. 2. The package 901 includes at least one interconnection die 201, the substrate 102, the substrate 104, the integrated device 103 and the encapsulation layer 106. The substrate 102 includes at least one dielectric layer 120 and a plurality of interconnects 122. The substrate 102 (e.g., first substrate) includes a first surface (e.g., bottom surface) and a second surface (e.g., top surface). The substrate 104 (e.g., second substrate) includes at least one dielectric layer 140 and a plurality of interconnects 142. The substrate 104 includes a first surface (e.g., bottom surface) and a second surface (e.g., top surface). The substrate 104 (e.g., second substrate) is coupled to the substrate 102 (e.g., first substrate) through the at least one interconnection die 101.

The package 802 includes the substrate 804, the integrated device 805, the plurality of wire bonds 850, the adhesive 870, and the encapsulation layer 806. The substrate 804 (e.g., third substrate) includes at least one dielectric layer 840 and a plurality of interconnects 842. The integrated device 805 is coupled to the substrate 804 through the adhesive 870. The plurality of wire bonds 850 is coupled to the integrated device 805 and the plurality of interconnects 842 of the substrate 804. The integrated device 805 may include a memory die. In some implementations, there may be several integrated devices 805 that are stacked on top of each other. The encapsulation layer 806 encapsulates the integrated device 805 and the plurality of wire bonds 850. The encapsulation layer 806 is coupled to the substrate 804 and the integrated device 805. The encapsulation layer 806 is located over the substrate 804 and the integrated device 805. The encapsulation layer 806 may include a mold, a resin and/or an epoxy. The encapsulation layer 806 may be a means for encapsulation. The encapsulation layer 806 may be provided by using a compression and transfer molding process, a sheet molding process, or a liquid molding process. The encapsulation layer 806 may be similar or the same as the encapsulation layer 106.

The integrated device 805 may be configured to be electrically coupled to the integrated device 103 through the plurality of wire bonds 850, the plurality of interconnects 842, the plurality of solder interconnects 860, the plurality of interconnects 142, the plurality of solder interconnects 114, the at least one interconnection die 201 (a plurality of interconnects 112), the plurality of solder interconnects 115, the plurality of interconnects 122 and/or the plurality of solder interconnects 130.

Figure 10B:
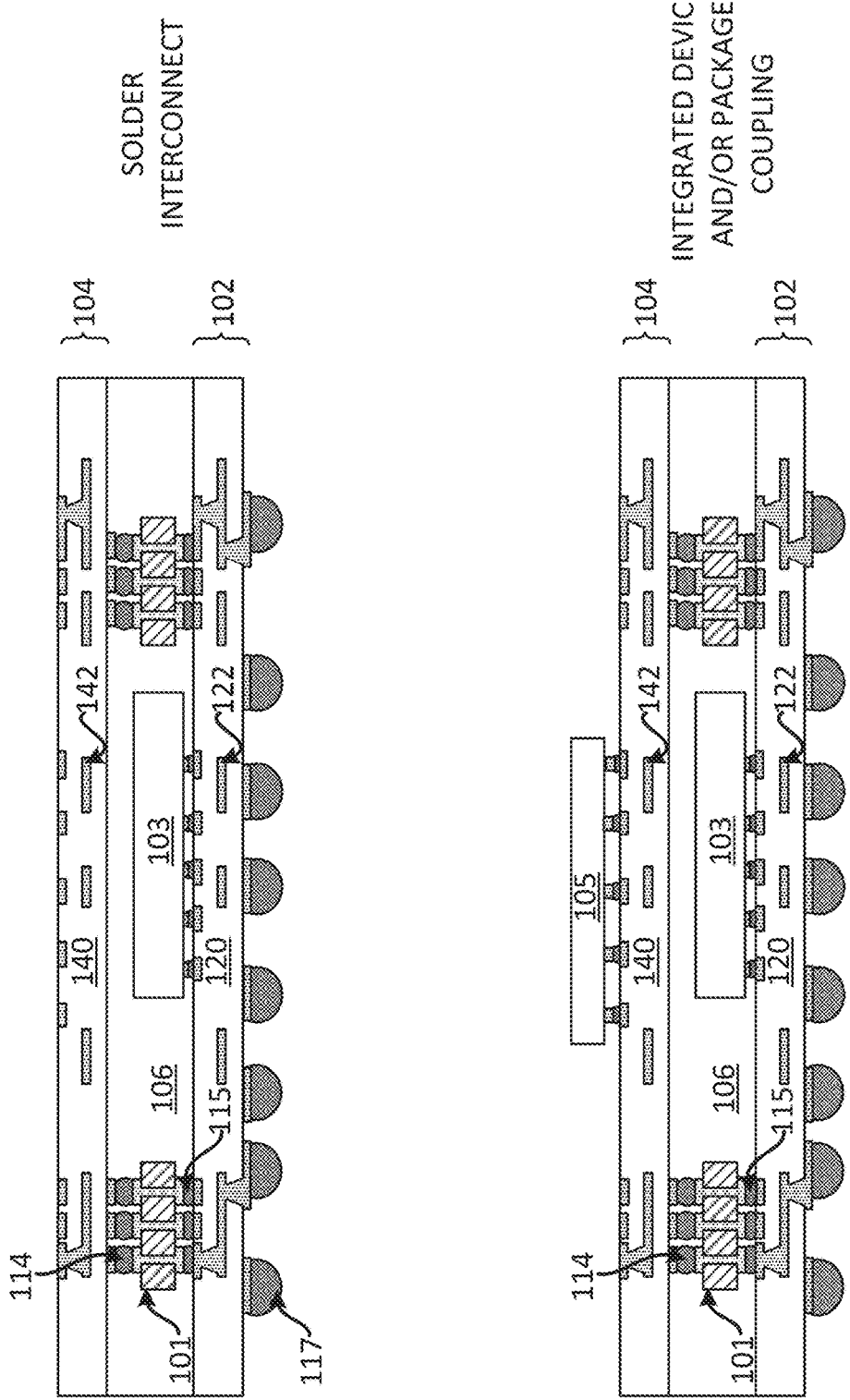

Exemplary Sequence for Fabricating a Package Comprising a Substrate and an Interconnection Die In some implementations, fabricating a package includes several processes. FIGS. 10A-10B illustrate an exemplary sequence for providing or fabricating a package. In some implementations, the sequence of FIGS. 10A-10B may be used to provide or fabricate the package 100. However, the process of FIGS. 10A-10B may be used to fabricate any of the packages (e.g., 200, 800, 801, 802, 900, 901) described in the disclosure.

It should be noted that the sequence of FIGS. 10A-10B may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 10A, illustrates a state after a substrate 102 is provided. The substrate 102 includes at least one dielectric layer 120 and a plurality of interconnects 122. The substrate 102 may include a first surface (e.g., bottom surface) and a second surface (e.g., top surface). The substrate 102 may be fabricated using the method as described in FIGS. 12A-12B. In some implementations, a cored substrate is provided (e.g., substrate that includes a core layer).

Stage 2 illustrates a state after an integrated device 103 is coupled to the second surface (e.g., top surface) of the substrate 102. The integrated device 103 may be coupled to the substrate 102 through the plurality of solder interconnects 130. A solder reflow process may be used to couple the integrated device 103 to the substrate 102. Stage 2 also illustrates a state after at least one interconnection die 101 is coupled to the second surface of the substrate 102. The at least one interconnection die 101 may be coupled to the substrate 102 through the plurality of solder interconnects 115. A solder reflow process may be used to couple the at least one interconnection die 101 to the substrate 102.

Stage 3 illustrates a state after the substrate 104 is coupled to the at least one interconnection die 101. The substrate 104 includes at least one dielectric layer 140 and a plurality of interconnects 142. The substrate 104 may include a first surface (e.g., bottom surface) and a second surface (e.g., top surface). The substrate 104 may be fabricated using the method as described in FIGS. 12A-12B. In some implementations, a cored substrate is provided (e.g., substrate that includes a core layer). The at least one interconnection die 101 may be coupled to the substrate 104 through the plurality of solder interconnects 114. A solder reflow process may be used to couple the substrate 104 to the at least one interconnection die 101. The integrated device 103 and the at least one interconnection die 101 may be located between the substrate 102 and the substrate 104. The substrate 104 may be coupled to the substrate 102 through the at least one interconnection die 101.

Stage 4 illustrates a state after an encapsulation layer 106 is provided between the substrate 102 and the substrate 104. The encapsulation layer 106 may encapsulate the integrated device 103 and the at least one interconnection die 101. The encapsulation layer 106 may be coupled to the second surface of the substrate 102 and the first surface of the substrate 104. The encapsulation layer 106 may include a mold, a resin and/or an epoxy. The encapsulation layer 106 may be a means for encapsulation. The encapsulation layer 106 may be provided by using a compression and transfer molding process, a sheet molding process, or a liquid molding process.

Stage 5, as shown in FIG. 10B, illustrates a state after a plurality of solder interconnects 117 is coupled to the substrate 102. The plurality of solder interconnects 117 may be coupled to the first surface (e.g., bottom surface) of the substrate 102. A solder reflow process may be used to couple the plurality of solder interconnects 117 to the plurality of interconnects 122 of the substrate 102.

Stage 6 illustrates a state after the integrated device 105 is coupled to the second surface (e.g., top surface) of the substrate 104. A solder reflow process may be used to couple the integrated devices and/or the passive devices to the substrate 104. It is noted that instead of an integrated device, another package, such as the package 802 may be coupled to the second surface (e.g., top surface) of the substrate 104.

Figure 11:
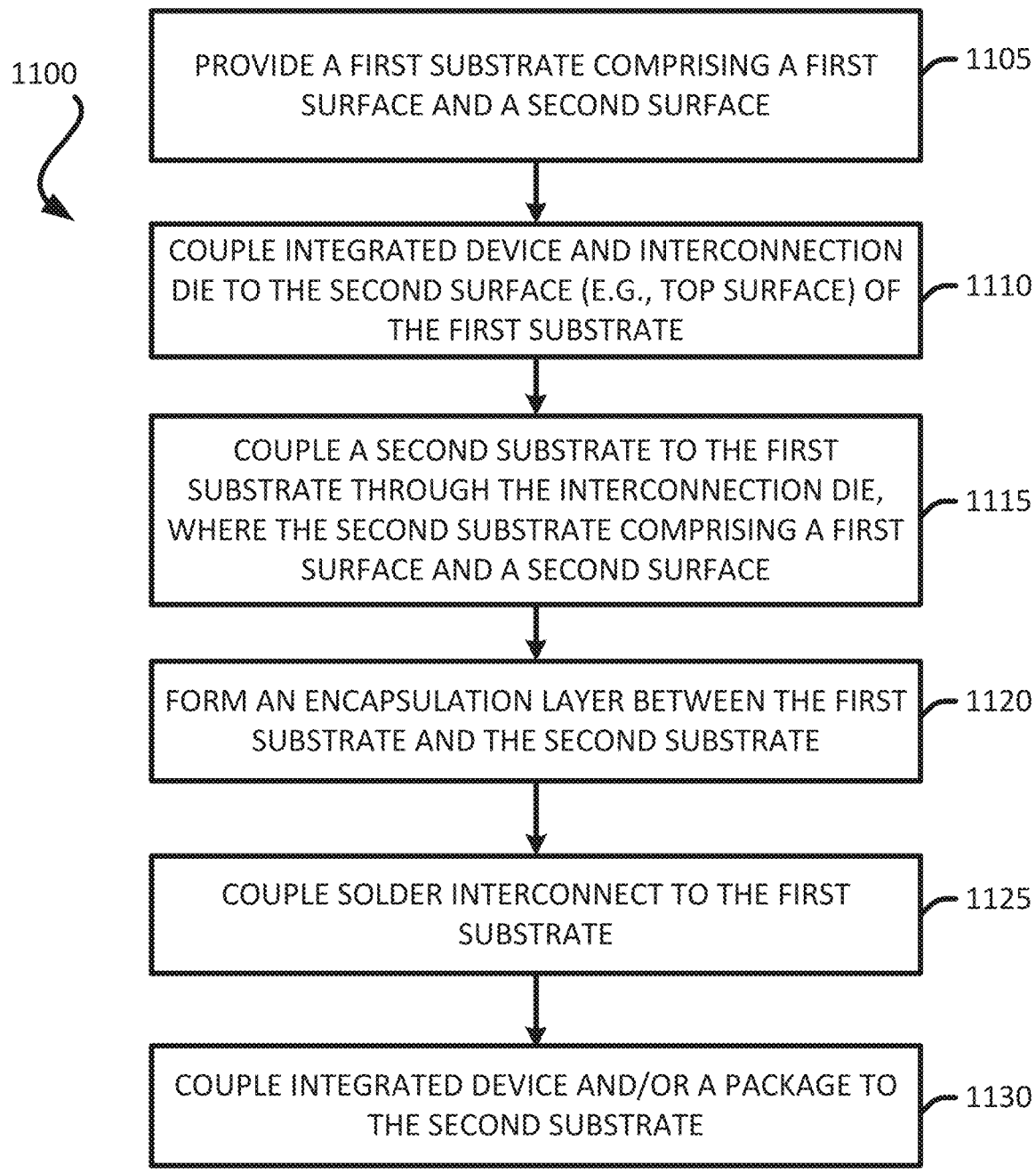
FIG. 11 illustrates an exemplary flow chart of a method for fabricating a package that includes a substrate and an interconnection die.

Exemplary Flow Diagram of a Method for Fabricating a Package Comprising a Substrate and an Interconnection Die In some implementations, fabricating a package includes several processes. FIG. 11 illustrates an exemplary flow diagram of a method 1100 for providing or fabricating a package. In some implementations, the method 1100 of FIG. 11 may be used to provide or fabricate the package 100 described in the disclosure. However, the method 1100 may be used to provide or fabricate any of the packages (e.g., 200, 800, 801, 802, 900, 901) described in the disclosure.

It should be noted that the method 1100 of FIG. 11 may combine one or more processes in order to simplify and/or clarify the method for providing or fabricating a package. In some implementations, the order of the processes may be changed or modified.

The method provides (at 1105) a substrate (e.g., 102). The substrate 102 may be a first substrate. The substrate 102 includes at least one dielectric layer 120 and a plurality of interconnects 122. The substrate 102 may include a first surface (e.g., bottom surface) and a second surface (e.g., top surface). The substrate 102 may be fabricated using the method as described in FIGS. 12A-12B. In some implementations, a cored substrate is provided (e.g., substrate that includes a core layer). Stage 1 of FIG. 10A illustrates and describes an example of providing a substrate.

The method couples (at 1110) an integrated device (e.g., 103) and at least one interconnection die (e.g., 101, 201) to the second surface (e.g., top surface) of the substrate 102. The integrated device 103 may be coupled to the substrate 102 through the plurality of solder interconnects 130. The integrated device 103 may be coupled to the substrate 102 through a plurality of pillar interconnects and/or a plurality of solder interconnects 130. A solder reflow process may be used to couple the integrated device 103 to the substrate 102. The at least one interconnection die 101 may be coupled to the substrate 102 through the plurality of solder interconnects 115. A solder reflow process may be used to couple the at least one interconnection die 101 to the substrate 102. Stage 2 of FIG. 10A illustrates and describes an example of coupling an integrated device and an interconnection die to a substrate.

The method couples (at 1115) a substrate (e.g., 104) to the substrate (e.g., 102) through the at least one interconnection die (e.g., 101, 201). The substrate 104 may be a second substrate. The substrate 104 includes at least one dielectric layer 140 and a plurality of interconnects 142. The substrate 104 may include a first surface (e.g., bottom surface) and a second surface (e.g., top surface). The substrate 104 may be fabricated using the method as described in FIGS. 12A-12B. In some implementations, a cored substrate is provided (e.g., substrate that includes a core layer). The substrate 104 may be coupled to the at least one interconnection die 101 through a plurality of solder interconnects 114. The substrate 104 may be coupled to the substrate 102 through the at least one interconnection die 101 such that the at least one interconnection die 101 and the integrated device 103 are located between the substrate 102 and the substrate 104. Stage 3 of FIG. 10A illustrates and describes an example of coupling a substrate to another substrate through an interconnection die.

The method forms (at 1120) an encapsulation layer (e.g., 106) between the substrate 102 and the substrate 104. The encapsulation layer 106 may encapsulate the integrated device 103 and the at least one interconnection die 101. The encapsulation layer 106 may be coupled to the second surface of the substrate 102. The encapsulation layer 106 may be coupled to the first surface of the substrate 104. The encapsulation layer 106 may include a mold, a resin and/or an epoxy. The encapsulation layer 106 may be a means for encapsulation. The encapsulation layer 106 may be provided by using a compression and transfer molding process, a sheet molding process, or a liquid molding process. Stage 4 of FIG. 10A illustrates and describes an example of providing an encapsulation layer.

The method couples (at 1125) a plurality of solder interconnects (e.g., 117) to the substrate 102. A solder reflow process may be used to couple the plurality of solder interconnects 117 to the first surface of the substrate 102. Stage 5 of FIG. 10B illustrates and describes an example of coupling solder interconnects to a substrate.

The method couples (at 1130) an integrated device (e.g., 105) to the second surface (e.g., top surface) of the substrate 104. A solder reflow process may be used to couple the integrated devices and/or the passive devices to the substrate 104. It is noted that instead of an integrated device, another package, such as the package 802 may be coupled to the second surface (e.g., top surface) of the substrate 104. Stage 6 of FIG. 10B illustrates and describes an example of coupling an integrated device to a substrate.

In some implementations, several packages are fabricated at the same time. In such cases, the method may singulate the package (e.g., 100, 200, 800, 801, 802, 900, 902).

Exemplary Sequence for Fabricating a Substrate

Figure 12A:
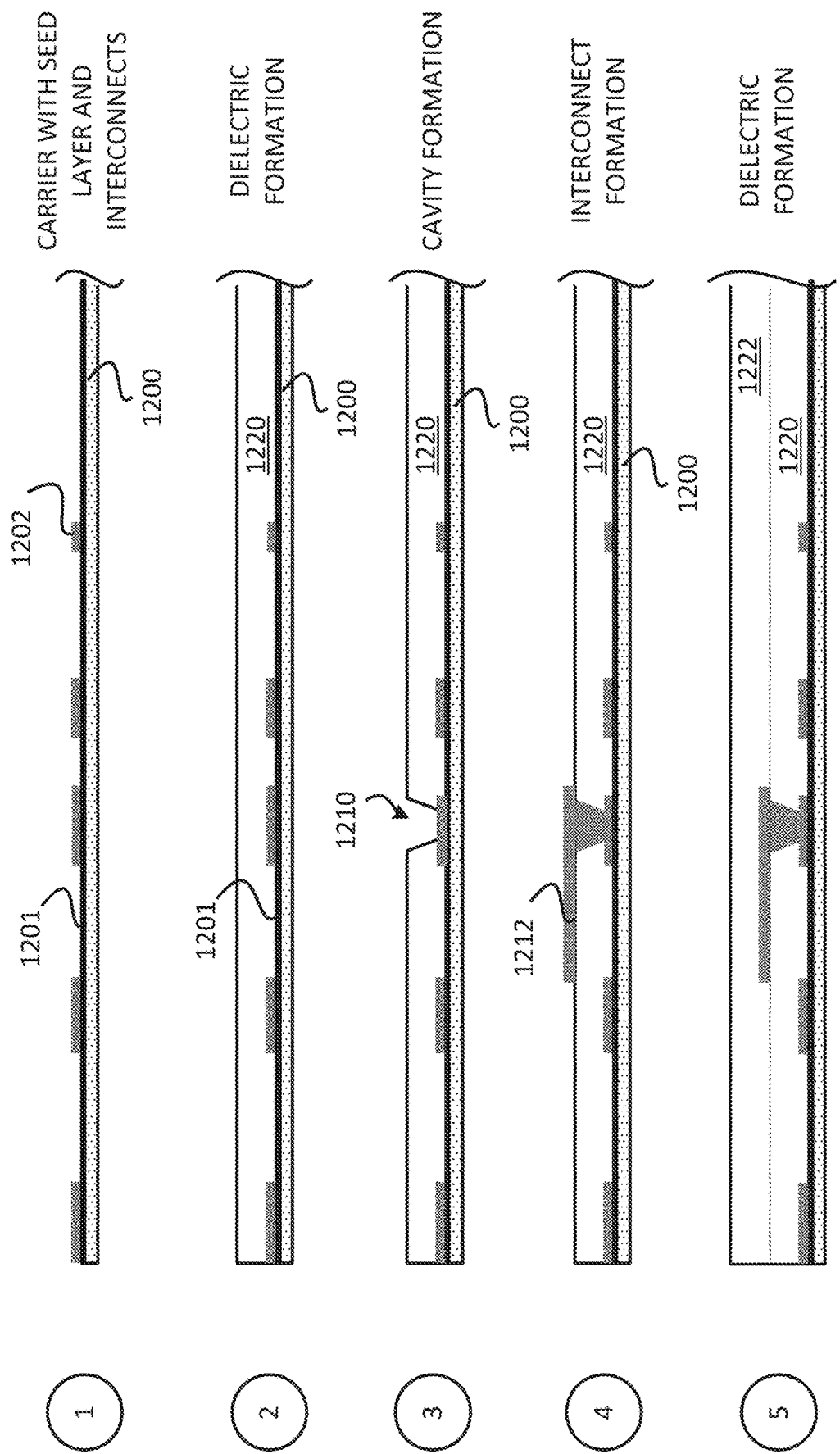
FIGS. 12A-12B illustrate an exemplary sequence for fabricating a substrate.
Figure 12B:
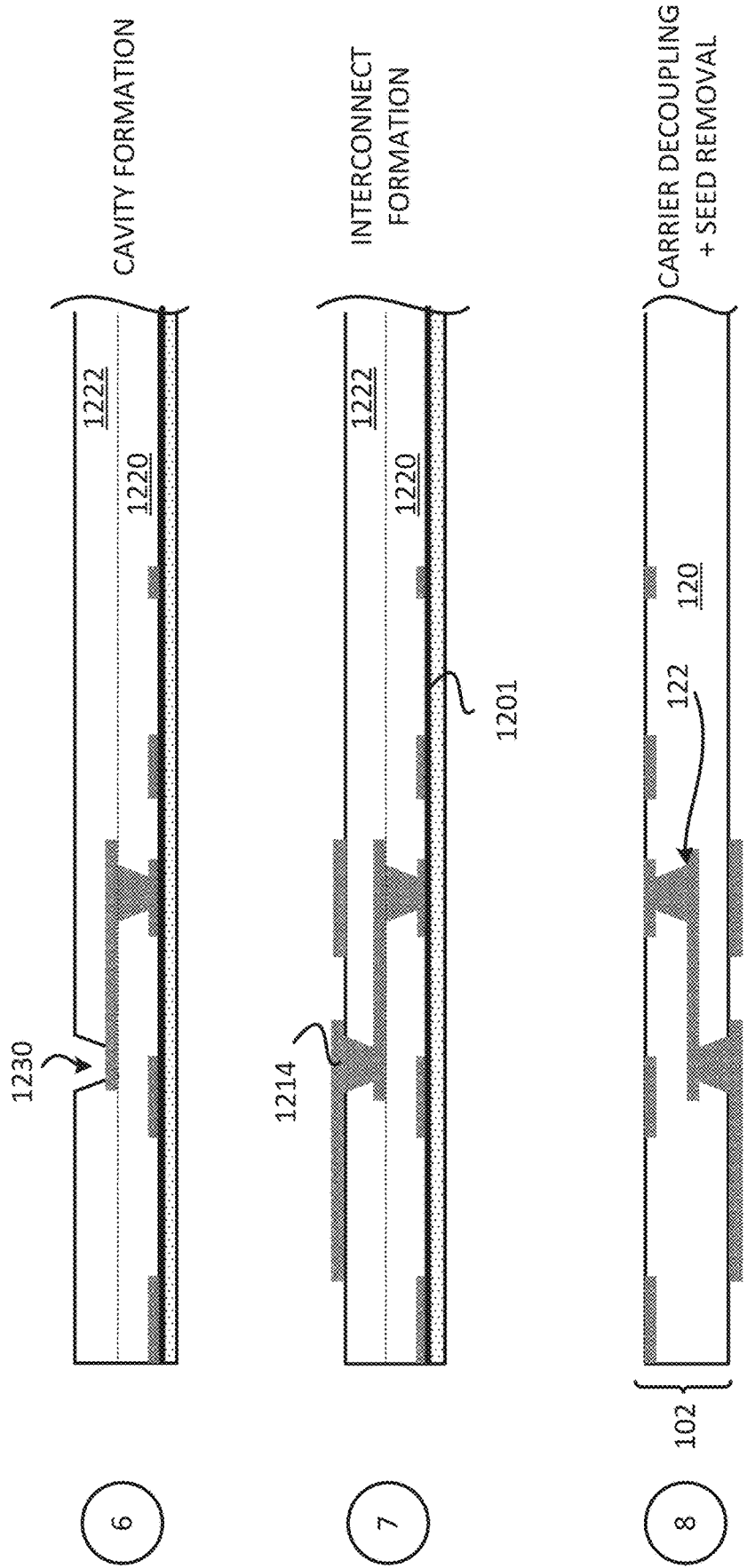

In some implementations, fabricating a substrate includes several processes. FIGS. 12A-12B illustrate an exemplary sequence for providing or fabricating a substrate. In some implementations, the sequence of FIGS. 12A-12B may be used to provide or fabricate the substrate 102. However, the process of FIGS. 12A-12B may be used to fabricate any of the substrates (e.g., 104, 804) described in the disclosure.

It should be noted that the sequence of FIGS. 12A-12B may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 12A, illustrates a state after a carrier 1200 is provided. A seed layer 1201 and interconnects 1202 may be located over the carrier 1200. The interconnects 1202 may be located over the seed layer 1201. A plating process and etching process may be used to form the interconnects 1202. In some implementations, the carrier 1200 may be provided with the seed layer 1201 and a metal layer that is patterned to form the interconnects 1202. The interconnects 1202 may represent at least some of the interconnects from the plurality of interconnects 122.

Stage 2 illustrates a state after a dielectric layer 1220 is formed over the carrier 1200, the seed layer 1201 and the interconnects 1202. A deposition and/or lamination process may be used to form the dielectric layer 1220. The dielectric layer 1220 may include prepreg and/or polyimide. The dielectric layer 1220 may include a photo-imageable dielectric. However, different implementations may use different materials for the dielectric layer.

Stage 3 illustrates a state after a plurality of cavities 1210 is formed in the dielectric layer 1220. The plurality of cavities 1210 may be formed using an etching process (e.g., photo etching process) or laser process.

Stage 4 illustrates a state after interconnects 1212 are formed in and over the dielectric layer 1220, including in and over the plurality of cavities 1210. For example, a via, pad and/or traces may be formed. A plating process may be used to form the interconnects.

Stage 5 illustrates a state after a dielectric layer 1222 is formed over the dielectric layer 1220 and the interconnects 1212. A deposition and/or lamination process may be used to form the dielectric layer 1222. The dielectric layer 1222 may include prepreg and/or polyimide. The dielectric layer 1222 may include a photo-imageable dielectric. However, different implementations may use different materials for the dielectric layer.

Stage 6, as shown in FIG. 12B, illustrates a state after a plurality of cavities 1230 is formed in the dielectric layer 1222. The plurality of cavities 1230 may be formed using an etching process (e.g., photo etching process) or laser process.

Stage 7 illustrates a state after interconnects 1214 are formed in and over the dielectric layer 1222, including in and over the plurality of cavities 1230. For example, a via, pad and/or traces may be formed. A plating process may be used to form the interconnects.

Stage 8 illustrates a state after the carrier 1200 is decoupled (e.g., detached, removed, grinded out) from at least one dielectric layer 120 and the seed layer 1201, portions of the seed layer 1201 are removed (e.g., etched out), leaving the substrate 102 that includes at least one dielectric layer 120 and the plurality of interconnects 122. The at least one dielectric layer 120 may represent the dielectric layer 1220 and/or the dielectric layer 1222. The plurality of interconnects 122 may represent the interconnects 1202, 1212 and/or 1214.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Exemplary Flow Diagram of a Method for Fabricating a Substrate

Figure 13:
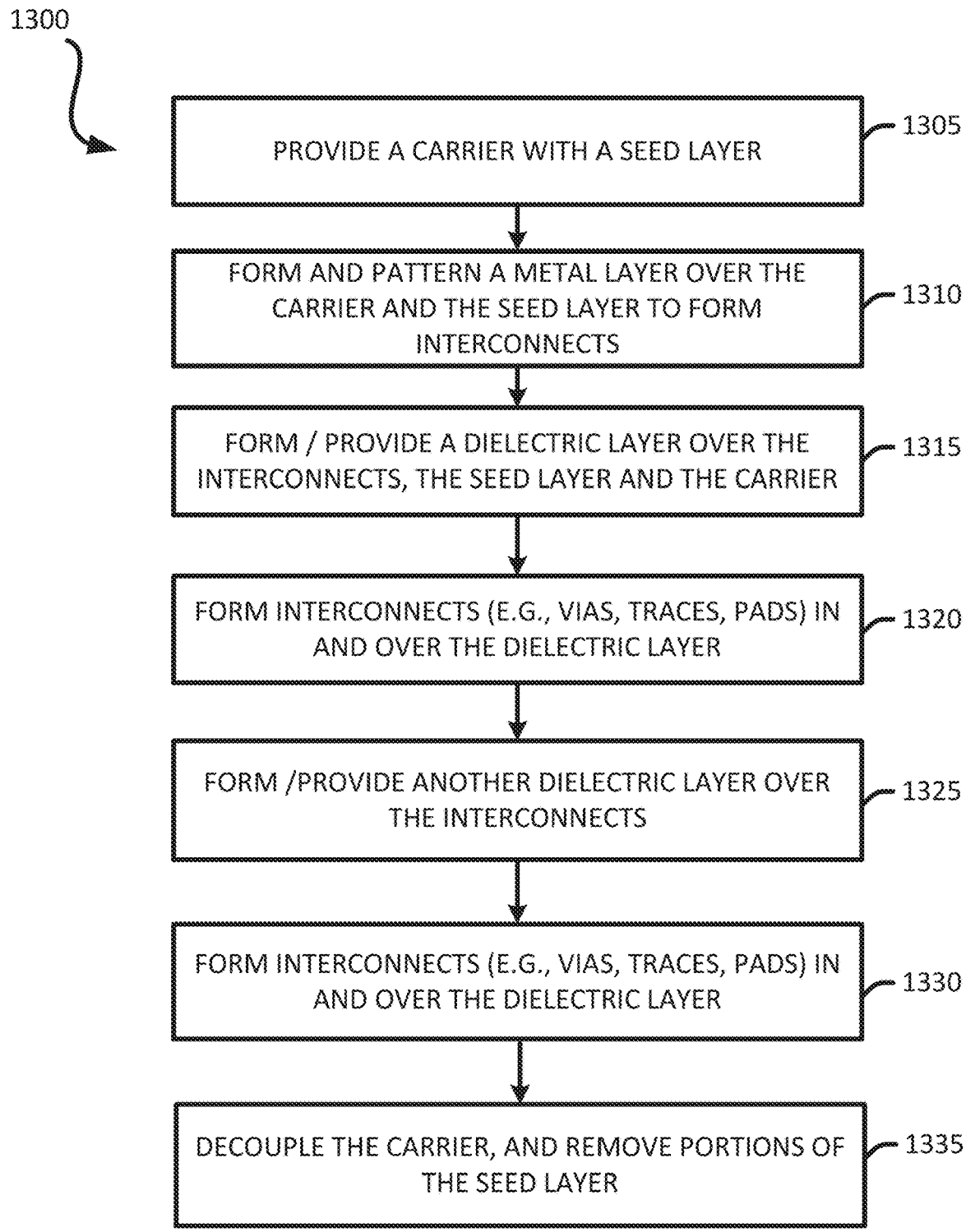
FIG. 13 illustrates an exemplary flow chart of a method for fabricating a substrate.

In some implementations, fabricating a substrate includes several processes. FIG. 13 illustrates an exemplary flow diagram of a method 1300 for providing or fabricating a substrate. In some implementations, the method 1300 of FIG. 13 may be used to provide or fabricate the substrate(s) of the disclosure. For example, the method 1300 of FIG. 13 may be used to fabricate the substrate 102.

It should be noted that the method 1300 of FIG. 13 may combine one or more processes in order to simplify and/or clarify the method for providing or fabricating a substrate. In some implementations, the order of the processes may be changed or modified.

The method provides (at 1305) a carrier (e.g., 1200). Different implementations may use different materials for the carrier 1200. The carrier 1200 may include a seed layer (e.g., 1201). The seed layer 1201 may include a metal (e.g., copper). The carrier may include a substrate, glass, quartz and/or carrier tape. Stage 1 of FIG. 12A illustrates and describes an example of a carrier with a seed layer that is provided.

The method forms and patterns (at 1310) interconnects over the carrier 1200 and the seed layer 1201. A metal layer may be patterned to form interconnects. A plating process may be used to form the metal layer and interconnects. In some implementations, the carrier and seed layer may include a metal layer. The metal layer is located over the seed layer and the metal layer may be patterned to form interconnects (e.g., 122). Stage 1 of FIG. 12A illustrates and describes an example of forming and patterning interconnects over a seed layer and a carrier.

The method forms/provides (at 1315) a dielectric layer 1220 over the seed layer 1201, the carrier 1200 and the interconnects 1202. A deposition and/or lamination process may be used to form the dielectric layer 1220. The dielectric layer 1220 may include prepreg and/or polyimide. The dielectric layer 1220 may include a photo-imageable dielectric. Forming the dielectric layer 1220 may also include forming a plurality of cavities (e.g., 1210) in the dielectric layer 1220. The plurality of cavities may be formed using an etching process (e.g., photo etching) or laser process. Stages 2-3 of FIG. 12A illustrate and describe an example of forming a dielectric layer and cavities in the dielectric layer.

The method forms (at 1320) interconnects in and over the dielectric layer. For example, the interconnects 1212 may be formed in and over the dielectric layer 1220. A plating process may be used to form the interconnects. Forming interconnects may include providing a patterned metal layer over and/or in the dielectric layer. Forming interconnects may also include forming interconnects in cavities of the dielectric layer. Stage 4 of FIG. 12A illustrates and describes an example of forming interconnects in and over a dielectric layer.

The method forms/provides (at 1325) a dielectric layer 1222 over the dielectric layer 1220 and the interconnects 1212. A deposition and/or lamination process may be used to form the dielectric layer 1222. The dielectric layer 1222 may include prepreg and/or polyimide. The dielectric layer 1222 may include a photo-imageable dielectric. Forming the dielectric layer 1222 may also include forming a plurality of cavities (e.g., 1230) in the dielectric layer 1222. The plurality of cavities may be formed using an etching process (e.g., photo etching) or laser process. Stages 5-6 of FIGS. 12A-12B illustrate and describe an example of forming a dielectric layer and cavities in the dielectric layer.

The method forms (at 1330) interconnects in and over the dielectric layer. For example, the interconnects 1214 may be formed in and over the dielectric layer 1222. A plating process may be used to form the interconnects. Forming interconnects may include providing a patterned metal layer over and/or in the dielectric layer. Forming interconnects may also include forming interconnects in cavities of the dielectric layer. Forming interconnects may include forming post interconnects. Stage 7 of FIG. 12B illustrates and describes an example of forming interconnects in and over a dielectric layer, including forming post interconnects.

The method decouples (at 1335) the carrier (e.g., 1200) from the seed layer (e.g., 1201). The carrier 1200 may be detached and/or grinded off. The method may also remove (at 1335) portions of the seed layer (e.g., 1201). An etching process may be used to remove portions of the seed layer 1201. Stage 8 of FIG. 12B illustrates and describes an example of decoupling a carrier and seed layer removal.

Different implementations may use different processes for forming the metal layer(s). In some implementations, a chemical vapor deposition (CVD) process, a physical vapor deposition (PVD) process, a sputtering process, a spray coating process, and/or a plating process may be used to form the metal layer(s).

Exemplary Electronic Devices

Figure 14:
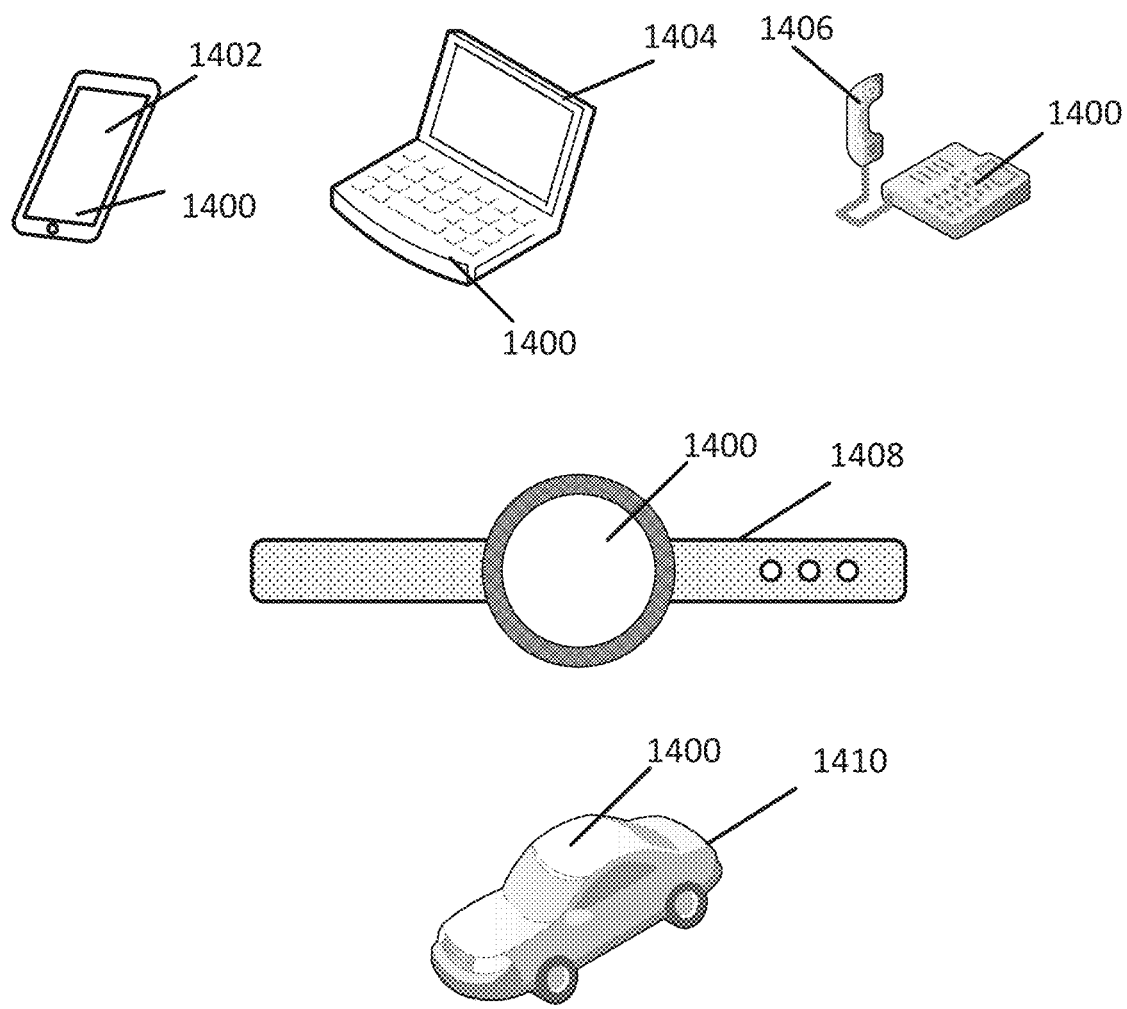
FIG. 14 illustrates various electronic devices that may integrate a die, an electronic circuit, an integrated device, an integrated passive device (IPD), a passive component, a package, and/or a device package described herein.

FIG. 14 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1402, a laptop computer device 1404, a fixed location terminal device 1406, a wearable device 1408, or automotive vehicle 1410 may include a device 1400 as described herein. The device 1400 may be, for example, any of the devices and/or integrated circuit (IC) packages described herein. The devices 1402, 1404, 1406 and 1408 and the vehicle 1410 illustrated in FIG. 14 are merely exemplary. Other electronic devices may also feature the device 1400 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-4, 5A-5B, 6A-6B, 7-9, 10A-10B, 11, 12A-12B and 13-14 may be rearranged and/or combined into a single component, process, feature or function or embodied in several components, processes, or functions. Additional elements, components, processes, and/or functions may also be added without departing from the disclosure. It should also be noted FIGS. 1-4, 5A-5B, 6A-6B, 7-9, 10A-10B, 11, 12A-12B and 13-14 and its corresponding description in the present disclosure is not limited to dies and/or ICs. In some implementations, FIGS. 1-4, 5A-5B, 6A-6B, 7-9, 10A-OB, 11, 12A-12B and 13-14 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X', For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace (e.g., trace interconnect), a via (e.g., via interconnect), a pad (e.g., pad interconnect), a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: A package comprising: a first substrate; a first integrated device coupled to the first substrate; an interconnection die coupled to the first substrate; a second substrate coupled to the first substrate through the interconnection die such that the first integrated device and the interconnection die are located between the first substrate and the second substrate; and an encapsulation layer coupled to first substrate and the second substrate, wherein the encapsulation layer is located between the first substrate and the second substrate.

Aspect 2: The package of aspect 1, wherein the interconnection die comprises: a die substrate; and a plurality of die interconnects.

Aspect 3: The package of aspect 2, wherein two neighboring die interconnects from the plurality of die interconnects have a pitch in a range of about 150-270 micrometers.

Aspect 4: The package of aspects 2 through 3, wherein the interconnection die has a thickness in a range of about 100-200 micrometers.

Aspect 5: The package of aspects 2 through 4, wherein the plurality of die interconnects includes a via die interconnect and a pad die interconnect.

Aspect 6: The package of aspects 2 through 5, wherein the die substrate includes glass and/or silicon.

Aspect 7: The package of aspects 1 through 6, further comprising a second integrated device coupled to the second substrate, wherein the first integrated device includes a first chiplet and the second integrated device includes a second chiplet.

Aspect 8: The package of aspects 1 through 7, wherein the interconnection die is located laterally to the first integrated device.

Aspect 9: The package of aspects 1 through 8, wherein the package is a package on package (PoP).

Aspect 10: The package of aspects 1 through 9, wherein the interconnection die is free of transistors.

Aspect 11: A device comprising a first package. The first package comprises a first substrate; a first integrated device coupled to the first substrate; means for die interconnection coupled to the first substrate; a second substrate coupled to the first substrate through the means for die interconnection such that the first integrated device and the means for die interconnection are located between the first substrate and the second substrate; and an encapsulation layer coupled to first substrate and the second substrate, wherein the encapsulation layer is located between the first substrate and the second substrate.

Aspect 12: The device of aspect 11, wherein the means for die interconnection comprises: a die substrate; and a plurality of die interconnects.

Aspect 13: The device of aspect 12, wherein two neighboring die interconnects from the plurality of die interconnects have a pitch in a range of about 150-270 micrometers.

Aspect 14: The device of aspects 12 through 13, wherein the interconnection die has a thickness in a range of about 100-200 micrometers.

Aspect 15: The device of aspects 12 through 14, wherein the plurality of die interconnects includes a via die interconnect and a pad die interconnect.

Aspect 16: The device of aspects 12 through 15, wherein the die substrate includes glass and/or silicon.

Aspect 17: The device of aspects 11 through 16, wherein the means for die interconnection is located laterally to the first integrated device.

Aspect 18: The device of aspects 11 through 17, further comprising a second package coupled to the first package through a plurality of solder interconnects, wherein the second package comprises: a third substrate; a second integrated device coupled to the third substrate; and a second encapsulation layer coupled to the third substrate and the second integrated device.

Aspect 19: The device of aspects 11 through 18, wherein the means for die interconnection is free of transistors.

Aspect 20: The device of aspects 11 through 19 wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 21: A method for fabricating a package, comprising: providing a first substrate comprising a first surface and a second surface; coupling a first integrated device to the second surface of the first substrate; coupling an interconnection die to the second surface of the first substrate; coupling a second substrate to the first substrate through the interconnection die, wherein the second substrate comprises a first surface and a second surface: and forming an encapsulation layer between the first substrate and the second substrate.

Aspect 22: The method of aspect 21, further comprising coupling a second integrated device to the second surface of the second substrate.

Aspect 23: The method of aspect 21, further comprising coupling a second package to the second surface of the second substrate through a plurality of solder interconnects, wherein the second package comprises: a third substrate; a second integrated device coupled to the third substrate; and a second encapsulation layer coupled to the third substrate and the second integrated device.

Aspect 24: The method of aspects 21 through 23, wherein the interconnection die comprises: a die substrate; and a plurality of die interconnects.

Aspect 25: The method of aspect 24, wherein two neighboring die interconnects from the plurality of die interconnects have a pitch in a range of about 150-270 micrometers.

Aspect 26: The method of aspects 24 through 25, wherein the interconnection die has a thickness in a range of about 100-200 micrometers.

Aspect 27: The method of aspects 24 through 26, wherein the plurality of die interconnects includes a via die interconnect and a pad die interconnect.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
   a first substrate comprising:
     at least one first dielectric layer; and
     a first plurality of interconnects;
   a first integrated device coupled to the first substrate;
   an interconnection die coupled to the first substrate through a first plurality of solder interconnects;
   a second substrate located over the first substrate, the interconnection die, and the first integrated device, the second substrate coupled to the first substrate through the interconnection die such that the first integrated device and the interconnection die are located between the first substrate and the second substrate,
   wherein the second substrate comprises:
     at least one second dielectric layer; and
     a second plurality of interconnects; and
   wherein the second substrate is coupled to the interconnection die through a second plurality of solder interconnects,
   an encapsulation layer coupled to the first substrate and the second substrate, wherein the encapsulation layer is located between the first substrate and the second substrate;
   wherein the interconnection die is located laterally to the first integrated device.

2. The package of claim 1, wherein the interconnection die comprises:
   a die substrate; and
   a plurality of die interconnects.

3. The package of claim 2, wherein two neighboring die interconnects from the plurality of die interconnects have a pitch in a range of about 150-270 micrometers.

4. The package of claim 2, wherein the interconnection die has a thickness in a range of about 100-200 micrometers.

5. The package of claim 2, wherein the plurality of die interconnects includes a via die interconnect and a pad die interconnect.

6. The package of claim 2, wherein the die substrate includes glass and/or silicon.

7. The package of claim 1, further comprising a second integrated device coupled to the second substrate, wherein the first integrated device includes a first chiplet and the second integrated device includes a second chiplet.

8. The package of claim 1, wherein the package is a package on package (PoP).

9. The package of claim 1, wherein the interconnection die is free of transistors.

10. A device comprising:
a first package comprising:
a first substrate comprising:
at least one first dielectric layer; and
a first plurality of interconnects;
a first integrated device coupled to the first substrate;
means for die interconnection coupled to the first substrate coupled to the first substrate through a first plurality of solder interconnects;
a second substrate located over the first substrate, the means for die interconnection, and the first integrated device, the second substrate coupled to the first substrate through the means for die interconnection such that the first integrated device and the means for die interconnection are located between the first substrate and the second substrate,
wherein the second substrate comprises:
at least one second dielectric layer; and
a second plurality of interconnects; and
wherein the second substrate is coupled to the means for die interconnection through a second plurality of solder interconnects,
an encapsulation layer coupled to the first substrate and the second substrate, wherein the encapsulation layer is located between the first substrate and the second substrate;
wherein the interconnection die is located laterally to the first integrated device.

11. The device of claim 10, wherein the means for die interconnection comprises:
a die substrate; and
a plurality of die interconnects.

12. The device of claim 11, wherein two neighboring die interconnects from the plurality of die interconnects have a pitch in a range of about 150-270 micrometers.

13. The device of claim 11, wherein the means for die interconnection has a thickness in a range of about 100-200 micrometers.

14. The device of claim 11, wherein the plurality of die interconnects includes a via die interconnect and a pad die interconnect.

15. The device of claim 11, wherein the die substrate includes glass and/or silicon.

16. The device of claim 10, further comprising a second package coupled to the first package through a third plurality of solder interconnects, wherein the second package comprises:
a third substrate;
a second integrated device coupled to the third substrate; and
a second encapsulation layer coupled to the third substrate and the second integrated device.

17. The device of claim 10, wherein the means for die interconnection is free of transistors.

18. The device of claim 10, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

19. A method for fabricating a package, comprising:
providing a first substrate comprising a first surface and a second surface, wherein the first substrate comprises a least one first dielectric layer and a first plurality of interconnects;
coupling a first integrated device to the second surface of the first substrate;
coupling an interconnection die to the second surface of the first substrate through a first plurality of solder interconnects;
coupling a second substrate to the first substrate through the interconnection die,
wherein the second substrate comprises a first surface and a second surface,
wherein the second substrate comprises at least one second dielectric layer and a second plurality of interconnects, and
wherein the second substrate is located over the first substrate, the interconnection die, and the first integrated device such that the first integrated device and the interconnection die are located between the first substrate and the second substrate, and
wherein the second substrate is coupled to the interconnection die through a second plurality of solder interconnects; and
forming an encapsulation layer between the first substrate and the second substrate.

20. The method of claim 19, further comprising coupling a second integrated device to the second surface of the second substrate.

21. The method of claim 19, further comprising coupling a second package to the second surface of the second substrate through a plurality of solder interconnects, wherein the second package comprises:
a third substrate;
a second integrated device coupled to the third substrate; and
a second encapsulation layer coupled to the third substrate and the second integrated device.

22. The method of claim 19, wherein the interconnection die comprises:
a die substrate; and
a plurality of die interconnects.

23. The method of claim 22, wherein two neighboring die interconnects from the plurality of die interconnects have a pitch in a range of about 150-270 micrometers.

24. The method of claim 22, wherein the interconnection die has a thickness in a range of about 100-200 micrometers.

25. The method of claim 22, wherein the plurality of die interconnects includes a via die interconnect and a pad die interconnect.

* * * * *